(12) United States Patent
Cooke et al.

(10) Patent No.: US 10,698,224 B1
(45) Date of Patent: Jun. 30, 2020

(54) OPTICAL LENS ASSEMBLIES, HEAD-MOUNTED DISPLAYS, AND METHODS OF ALTERING OPTICAL PROPERTIES OF OPTICAL LENS ASSEMBLIES

(71) Applicant: Oculus VR, LLC, Menlo Park, CA (US)

(72) Inventors: John M. Cooke, Bothell, WA (US); Katherine Marie Smyth, Seattle, WA (US); Andrew John Ouderkirk, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 156 days.

(21) Appl. No.: 16/013,837

(22) Filed: Jun. 20, 2018

Related U.S. Application Data
(60) Provisional application No. 62/646,900, filed on Mar. 22, 2018.

(51) Int. Cl.
*G02B 7/04* (2006.01)
*G02B 3/14* (2006.01)
*G02B 27/01* (2006.01)

(52) U.S. Cl.
CPC .......... *G02B 27/0179* (2013.01); *G02B 3/14* (2013.01); *G02B 7/04* (2013.01); *G02B 27/0172* (2013.01); *G02B 27/0176* (2013.01); *G02B 2027/0159* (2013.01); *G02B 2027/0185* (2013.01)

(58) Field of Classification Search
CPC ... G02B 7/04; G02B 3/14; G02B 3/12; G02B 26/004; G02B 27/0172; G02B 27/0176; G02B 27/0179
See application file for complete search history.

(56) References Cited

U.S. PATENT DOCUMENTS

2017/0045649 A1* 2/2017 Bolis ................... G02B 26/004

OTHER PUBLICATIONS

Adaptive glasses, http://tvc.utah.edu, as accessed on Mar. 13, 2018.
Billah et al., Microstructure Evolution and Electrical Characterization of Lanthanum doped Barium Titanate (BaTiO3) Ceramics, Int'l Conference on Mechanical Engineering, AIP Conf. Proc. 1754, 030006-1-030006-7 (Jul. 12, 2016).
Cao et al., Grain Size and Domain Size Relations in Bulk Ceramic Ferroelectric Materials, J. Phys. Chem Solids vol. 57, No. 10, pp. 1499-1505, 1996.
Ding et al., "Surface profiling of an aspherical liquid lens with a varied thickness membrane," Optics Express 3122-3132, vol. 25, No. 4 (Feb. 6, 2017).

(Continued)

*Primary Examiner* — Ryan D Howard
(74) *Attorney, Agent, or Firm* — FisherBroyles, LLP

(57) ABSTRACT

The disclosed optical lens assemblies may include a deformable optical element, at least one primary actuator for deforming, and thus changing at least one optical property of, the deformable optical element, and at least one augmentation mechanism that may be configured to augment the deformation of the deformable optical element by the primary actuator. Various head-mounted displays incorporating such an optical lens assembly, and related methods, are also disclosed.

24 Claims, 14 Drawing Sheets

(56) References Cited

OTHER PUBLICATIONS

He et al., Linear Electro-Optic Properties of Orthorhombic PZN-8%PT Single Crystal, IEEE Transactions on Ultrasonics, Ferroelectrics, and Frequency Control, vol. 58, No. 6 (Jun. 1, 2011).
http://glidewelldental.com/education/inclusive-dental-implant-magazine-volume-2-issue-4/, as accessed on Jun. 12, 2018.
http://www.optotune.com/technology/focus-tunable-lenses, as accessed on Mar. 13, 2018.
http://www.polight.com/technology-and-products/how-does-it-work/default.aspx, as accessed on Mar. 13, 2018.
https://adlens.com/how-it-works/, as accessed on Mar. 28, 2018.
https://www.piceramic.com/en/piezo-technology/picma/, as accessed on Mar. 14, 2018.
https://www.piceramic.com/en/piezo-technology/properties-piezo-actuators/displacement-modes/, as accessed on Mar. 14, 2018.
Jiang et al., Transparent Electro-Optic Ceramics and Devices, Optoelectronic devices and integration, pts 1 and 2; SPIE-Int Soc Optical Engineering, Bellingham, pp. 380-394 (Jan. 17, 2005).
Keplinger et al., Stretchable, Transparent, Ionic Conductors, Science Magazine, vol. 341, pp. 984-987 (Aug. 30, 2013).
Kong et al., Transparent Ceramics, Topics in Mining, Metallurgy, and Materials Engineering, Ch. 2: Transparent Ceramic Materials, pp. 29-91 (2015).
Patra et al., Comparison on Optical Properties of Pure and Doped Lithium Tetraborate Single Crystals and Glasses, Solid State Physics: Proceedings of the 56th DAE Solid State Physics Symposium 2011, AIP Conf. Proc. 1447, 1335-46 (Dec. 11, 2012).
Riegler et al., Index Matching Silicone for High Brightness LED Packaging (Mar. 18, 2005).
Shian et al., Tunable Lenses using Transparent Dielectric Elastomer Actuators, Optics Express, vol. 21, No. 7 (Apr. 2, 2013).
The effect of slip on the motion of a sphere close to a wall and of two adjacent spheres, L. M. Hocking (Jul. 1, 1973).
Wang et al., A Highly Stretchable, Transparent, and Conductive Polymer, Sci. Adv. 2017; 3:e1602076 (Mar. 10, 2017).
www.americanpiezo.com/knowledge-center/piezo-theory/new-materials/html, as accessed on Mar. 15, 2018.
Zhao et al., "Spherical aberration free liquid-filled tunable lens with variable thickness membrane," Optics Express 21264-21278, vol. 23, No. 16. (Aug. 5, 2015).
Andrew J. Ouderkirk, et al.; Apparatuses, Systems, And Methods For Adjusting Fluid Lenses; U.S. Appl. No. 16/008,635, filed Jun. 14, 2018.
Andrew John Ouderkirk, et al.; Electroactive Polymer Devices And Nanovoided Polymer Materials And Methods And Systems For Fabrication Thereof; U.S. Appl. No. 16/106,945, filed Aug. 21, 2018.
Andrew John Ouderkirk, et al.; Electroactive Polymer Devices, Systems, And Methods; U.S. Appl. No. 16/035,562, filed Jul. 13, 2018.
Andrew John Ouderkirk, et al.; Electroactive Polymer Devices, Systems, And Methods; U.S. Appl. No. 16/059,091, filed Aug. 9, 2018.
Andrew John Ouderkirk, et al.; Multi-Element Prescription Lenses With Eye-Tracking; U.S. Appl. No. 16/041,634, filed Jul. 20, 2018.
Andrew John Ouderkirk, et al.; Nanovoided Electroactive Polymer Devices, Systems, And Methods; U.S. Appl. No. 16/041,858, filed Jul. 23, 2018.
Andrew John Ouderkirk, et al.; Optical Devices, Systems, And Methods Of Manufacturing; U.S. Appl. No. 62/646,900, filed Mar. 22, 2018.
Andrew John Ouderkirk, et al.; Optical Devices, Systems, And Methods Of Manufacturing; U.S. Appl. No. 62/650,254, filed Mar. 29, 2018.
Andrew John Ouderkirk, et al.; Optical Lens Assemblies And Related Methods; U.S. Appl. No. 16/018,752, filed Jun. 26, 2018.
Katherine Marie Smyth, et al.; Systems And Methods For Actuation Of Asymmetric Optical Elements; U.S. Appl. No. 15/992,731, filed May 30, 2018.
John M. Cooke, et al.; Optical Lens Assemblies, Head-Mounted Displays, And Related Methods; U.S. Appl. No. 16/021,580, filed Jun. 28, 2018.
Katherine Marie Smyth, et al.; Optical Lens Assemblies And Related Methods; U.S. Appl. No. 16/018,746, filed Jun. 26, 2018.
Katherine Marie Smyth, et al.; Optical Lens Assemblies, Head-Mounted Displays, And Related Methods; U.S. Appl. No. 16/016,428, filed Jun. 22, 2018.
Katherine Marie Smyth, et al.; Optical Lens Assemblies, Head-Mounted Displays, and Related Methods; U.S. Appl. No. 16/021,650, filed Jun. 28, 2018.

\* cited by examiner

OPTICAL LENS ASSEMBLIES, HEAD-MOUNTED DISPLAYS, AND METHODS OF ALTERING OPTICAL PROPERTIES OF OPTICAL LENS ASSEMBLIES

CROSS REFERENCE TO RELATED APPLICATION

This application claims the benefit of U.S. Provisional Application No. 62/646,900, filed Mar. 22, 2018, the entire disclosure of which is incorporated herein by this reference.

BACKGROUND

Adjustable-lens systems may be useful in a variety of devices, including eyeglasses, cameras, and virtual or augmented reality ("VR/AR") systems, such as to adjust the focus of a display element (e.g., screen) or of a real-world image viewed by a user. The actuation of liquid lenses and other deformable optical lens assemblies generally involves generating forces in the range of about 1N-10N by an electromechanical actuator, depending on the amount of optical power shift desired and the size and construction of the optical lens assembly. Deformable portions of the optical lens assemblies may react to such forces with displacement distances in, for example, the hundreds of microns to millimeter range.

Electromechanical actuators for optical lens assemblies are conventionally designed to be small and lightweight to be considered viable as a consumer-wearable product for a head-mounted display ("HMD"), such as VR/AR glasses or headsets. In addition, the displacement capacity of some small actuators, such as piezoelectric devices, is often dependent on a reaction force of the load, which generally increases over the actuation stroke in the case of deforming portions of optical lens assemblies. Accordingly, the design of actuation mechanisms for HMDs may involve balancing several factors, such as stroke distance capabilities, force capabilities, size, and weight.

SUMMARY

As will be described in greater detail below, the instant disclosure describes optical lens assemblies and HMDs including a deformable optical element that may be deformed by actuation of a primary actuator, with the deformation augmented by an augmentation mechanism.

In some embodiments, the present disclosure includes optical lens assemblies that include a deformable optical element, at least one primary actuator, and at least one augmentation mechanism. The primary actuator may be configured to deform, and thus change at least one optical property of, the deformable optical element, while the augmentation mechanism may be configured to augment the deformation of the deformable optical element by the primary actuator.

In some examples, the optical lens assembly may also include a housing supporting the deformable optical element, the primary actuator, and the augmentation mechanism. The housing may include a frame for an HMD.

In some examples, the primary actuator may be configured to apply a primary force to deform the deformable optical element, and the augmentation mechanism may include a cam positioned to apply a secondary force to the deformable optical element. The augmentation mechanism may also include a spring coupled to the cam. The spring may also be coupled to a spring attachment element of a housing supporting the deformable optical element, primary actuator, and augmentation mechanism. Another cam may be positioned to apply another secondary force to the deformable optical element. The spring may also be coupled to the other cam. A sleeve may surround at least a portion of the spring. The optical assembly may also include another deformable optical element, and the cam may be positioned to apply another secondary force to the other deformable optical element.

In some examples, the primary actuator may be configured to apply a primary force to deform the deformable optical element, and the augmentation mechanism may include a spring positioned to apply a secondary force to the deformable optical element. The spring may be a coil spring or a disk spring, for example.

In some examples, the augmentation may include a magnetic element, or a rigid lens-coupling shuttle and a spring element. The augmentation mechanism may include a metallic spring, an elastomeric spring, a composite material spring, a permanent magnet, a flexure element, a lever, and/or an electromagnetic element. The augmentation mechanism may include a non-linear spring or flexure element positioned to apply a force to the deformable optical element in series or in parallel with the primary actuator. The augmentation mechanism may be configured to apply a secondary force to the deformable optical element during only a portion of an actuation stroke of the primary actuator.

In some examples, the primary actuator may include a perimeter-mounted piezoelectric actuator, a voice coil actuator, an electromagnetic motor actuator, a shape memory alloy actuator, and/or an electroactive polymer actuator. A force distributor ring may be positioned adjacent to the deformable optical element. The primary actuator may be configured to apply a primary force to the deformable optical element through the force distributor ring.

In some embodiments, a corresponding HMD may include a support frame, an optical lens assembly coupled to the support frame, a primary actuator coupled to the support frame, an augmentation mechanism, and a display element coupled to the support frame. The optical lens assembly may include a deformable optical element. The primary actuator may be configured to deform, and thus change at least one optical property of, the deformable optical element. The augmentation mechanism may be configured to augment the deformation of the deformable optical element. Actuation of the augmentation mechanism may be at least partially dependent on actuation of the primary actuator.

In some examples, the support frame may include an augmented reality or virtual reality glasses frame. The augmentation mechanism may include a cam, a coil spring, a disk spring, a shuttle, and/or a magnetic element. The HMD may also include another optical lens assembly coupled to the support frame. The other optical lens assembly may include another deformable optical element, and the display element may be positioned between the optical lens assembly and the other optical lens assembly. The primary actuator and the augmentation mechanism may be configured to simultaneously deform both the deformable optical element and the other deformable optical element.

The present disclosure also describes various methods of altering optical properties of an optical lens assembly. In accordance with such methods, a deformable optical element may be deformed with a primary actuator to alter an optical property of the deformable optical element. The deformation of the deformable optical element by the primary actuator may be augmented with an augmentation mechanism. In some examples, the method may include changing the augmentation mechanism from a higher potential energy state to a lower energy state to augment the deformation of the deformable optical element.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of example embodiments and are a part of the specification. Together with the following description, these drawings demonstrate and explain various principles of the instant disclosure.

Figure 1:
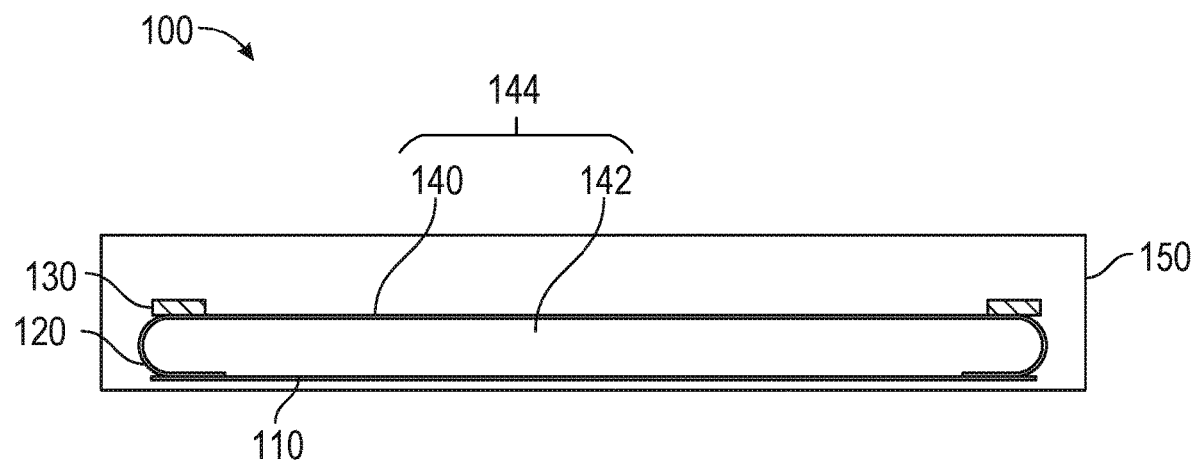
FIG. 1 is a cross-sectional side view of an optical lens assembly in a neutral, non-actuated state.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the example embodiments described herein are not intended to be limited to the particular forms disclosed. Rather, the instant disclosure covers all modifications, equivalents, combinations, and alternatives falling within the scope of the appended claims.

DETAILED DESCRIPTION

The present disclosure is generally directed to optical lens assemblies and associated head-mounted displays and methods that include a deformable optical element. As will be explained in greater detail below, embodiments of the present disclosure may include optical lens assemblies that include a primary actuator and an augmentation mechanism that are configured to deform a deformable optical element to alter an optical property (e.g., adaptive or accommodative property) of the optical lens assembly. The primary actuator may be configured to apply a primary force to deform the deformable optical element, and the augmentation mechanism may be configured to apply a secondary force to deform the deformable optical element. The augmentation devices of this disclosure may enable the primary actuator to be smaller, use less power, or require a lower peak force output for a given deformation, or to have increased deformation (and thus optical power) for the same size of primary actuator.

Figure 2:
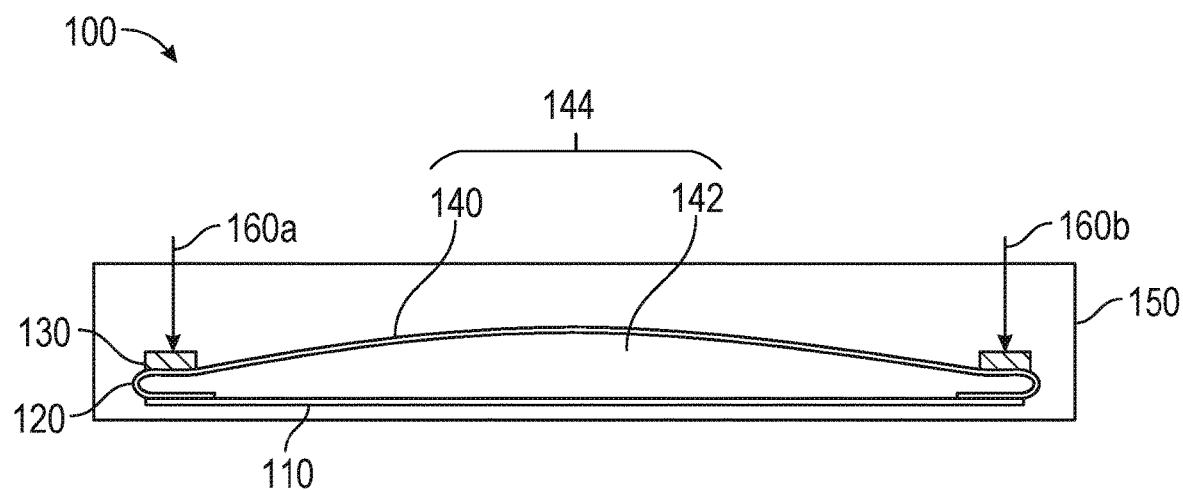
FIG. 2 is a cross-sectional side view of the optical lens assembly of FIG. 1 in a convex actuated state.

The following will provide, with reference to FIGS. 1-29, detailed descriptions of example optical lens assemblies, HMDs including the same, and associated methods. FIGS. 1 and 2 illustrate an optical lens assembly that may be actuated by a primary actuator. FIGS. 3-28 illustrate different embodiments of optical lens assemblies and HMDs that include an augmentation mechanism in addition to a primary actuator. FIG. 29 is a flow chart illustrating a method of altering optical properties of an optical lens assembly.

FIGS. 1 and 2 are provided to assist the reader in better understanding the present disclosure, and are not admitted as prior art for any purpose. FIG. 1 shows a cross-sectional side view of an optical lens assembly 100 including a rigid or semi-rigid support element 110, a deformable element 140 positioned over the support element 110, and a force distributor ring 130 positioned over the deformable element proximate an outer periphery 120 of the deformable element. A deformable medium 142 may be disposed within a cavity defined between the support element 110 and the deformable element 140. Each of the support element 110, the deformable element 140, and the deformable medium 142 may be substantially transparent to allow light to pass through to an eye of a user. Accordingly, at least portions of the support element 110, the deformable element 140, and the deformable medium 142 may be positioned in an optical aperture of the optical lens assembly 100, which may refer to a portion of the optical lens assembly that allows the passage of light to a user's eye.

In some examples, any relational term, such as "first," "second," "over," "under," "on," "top," etc., may be used for clarity and convenience in understanding the disclosure and accompanying drawings, and does not necessarily connote or depend on any specific preference, orientation, or order, except where the context clearly indicates otherwise. In some examples, the phrase "substantially transparent" may refer to an element exhibiting greater than about 20% transmissivity and less than about 10% haze in the visible light spectrum. In some examples, the term "substantially," in reference to a given parameter, property, or condition may generally refer to a degree that one of ordinary skill in the art would understand that the given parameter, property, or condition is met with a small degree of variance, such as within acceptable manufacturing tolerances. By way of example, depending on the parameter, property, or condition that is substantially met, the parameter, property, or condition may be at least 90% met, at least 95% met, or at least 99% met.

The support element 110, deformable element 140, deformable medium 142, and force distributor ring 130 may be coupled to a housing 150 (e.g., an eyeglass frame element, a VR headset frame element, etc.). A deformable optical element 144 of the optical lens assembly 100 may include, for example, the deformable element 140 and the deformable medium 142. In some examples, the phrase "deformable optical element" may refer to an element (including one or more materials or sub-elements) that is configured to be deformed to alter an optical property (e.g., an accommodative property or an adaptive optical property) of the optical lens assembly. In some examples, the term "accommodative" or "accommodation" may refer to changing an optical power. In some examples, the term "adaptive" may refer to tunability for providing control, compensation, and/or correction of wave front errors such as distortion and aberration(s).

In FIG. 1, the deformable element 140 and deformable medium 142 are in a neutral, non-actuated state. In the non-actuated state, an upper surface of the deformable element 140 may have a substantially planar shape, and the optical lens assembly 100 may be configured and positioned to not substantially alter an image or view passing through the optical lens assembly 100. In other words, the non-actuated state may be a zero-optical power state.

The support element 110 may be or include a substantially transparent material with a higher relative rigidity than the deformable element 140 and the deformable medium 142. By way of example, the support element 110 may be or include one or more of a glass material, a sapphire material, a crystal material (e.g., quartz), or a polymer material (e.g., polycarbonate). The support element 110 may provide a protective barrier for the user's eye, for the deformable element 140 and the deformable medium 142, and for other components of the optical lens assembly 100 (e.g., a display element, an actuator, etc.). The support element 110 may also include an eye-tracking element, which may be configured for estimating an interpupillary distance of the user's eyes, a gaze distance, and/or a focal point. The eye-tracking element, if present, may include a selective-transmission element that transmits light having a selected property and that does not transmit light that does not have the selected property. For example, the support element 110 may include a coating or material that allows visible light to pass while reflecting non-visible light (e.g., infrared light). In this example, an infrared light source may direct infrared light to the support element 110, which may be reflected onto the user's eye. An infrared camera may detect infrared light that is reflected from the user's eye and back to the support element 110, to track the user's eye.

As shown in FIG. 1, the support element 110 may be a substantially planar element that does not substantially alter an image viewed through the support element 110. In other embodiments, the support element 110 may include a corrective ophthalmic lens (e.g., a positive-optical power (i.e., magnifying) lens, a negative-optical power (i.e., diminishing) lens, a lens for correction of an aberration, etc.), or another optical lens element. Optionally, an anti-reflective coating may be applied to the support element 110. The outer periphery 120 of the deformable element 140 may be directly or indirectly coupled to the support element 110, which may define a cavity therebetween for containing the deformable medium 142.

The deformable element 140 may include a substantially transparent, flexible film of a single material or multiple materials. By way of example and not limitation, the deformable element may include at least one of a polymer material, a ceramic material, a glass material, a crystalline material, or a composite material.

The deformable medium 142 may be a substantially transparent material with mechanical properties that allow for deformation upon actuation of the optical lens assembly 100. By way of example and not limitation, the deformable medium 142 may be or include a gas (e.g., air, nitrogen, etc.), a liquid (e.g., water, oil, saline solution, a high-refractive index liquid, etc.), a polymer material, a gel (e.g., a silicone gel), or a foam (e.g., a silica aerogel), etc.

FIG. 2 shows the optical lens assembly 100 in an actuated state, with the deformable element 140 being deformed to a desired shape (e.g., convex). The deformation of the deformable element 140 may occur as a result of one or more forces 160*a*, 160*b* on the force distributor ring 130 from a primary actuator (e.g., an electromechanical actuator). In the view of FIG. 2, the force distributor ring 130 has been forced downward by the force(s) 160*a*, 160*b* to push fluid from proximate the outer periphery 120 into a middle area of the deformable element 140, increasing a pressure proximate to the deformable element 140, and causing a central region of the deformable element 140 to bulge upward (in the perspective of FIG. 2). In the configuration shown in FIGS. 1 and 2, substantially all the force(s) 160*a*, 160*b* required to deform the deformable optical element 144 of the optical lens assembly 100 to a desired shape may be generated by the primary actuator. Accordingly, the primary actuator may be selected to have force capabilities, displacement capabilities, and a size sufficient to generate all of the required force(s) 160*a*, 160*b*.

In some examples, the term "electromechanical actuator" may refer to a piezoelectric material or device, an electroactive polymer, an electrostrictive polymer, an electroactive gel or liquid, an electroactive foam or structured polymer, a shape memory alloy, a voice coil, a pneumatic actuator, an electromagnetic motor (including for example a servo motor, a stepper motor, a DC motor, or a similar motor), a hydraulic actuator, or a combination thereof. In some examples, the term "electroactive" may refer to a property of a material or composite material that deforms in response to an application of electrical energy (e.g., a voltage) and may generate electrical energy when strained or deformed.

Figure 3:
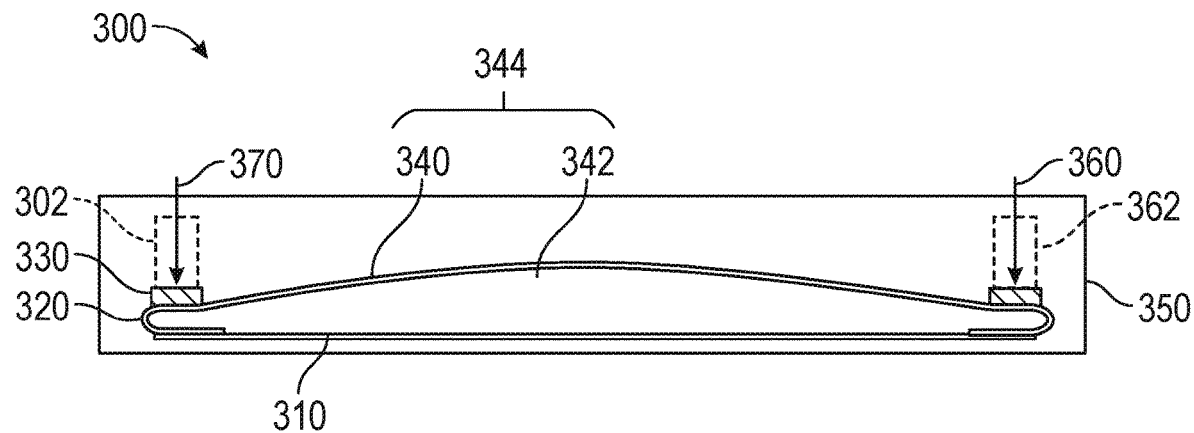
FIG. 3 is a cross-sectional side view of an optical lens assembly according to some embodiments of the present disclosure.

FIG. 3 shows an optical lens assembly 300 in a convex actuated state, according to some embodiments of the present disclosure. As shown in this figure, the optical lens assembly 300 may include a support element 310, a deformable element 340 including an outer periphery 320 coupled to the support element 310, a force distributor ring 330 coupled to the deformable element 340 proximate the outer periphery 320, a deformable medium 342 disposed in a cavity defined between the support element 310 and the deformable element 340, at least one primary actuator 362, at least one augmentation mechanism 302, and a housing 350 (e.g., an eyeglasses frame, a frame element of an HMD) supporting the other components of the optical lens assembly 300. A deformable optical element 344 of the optical lens assembly 300 may include at least the deformable element 340 and the deformable medium 342.

The primary actuator(s) 362 may be configured and positioned to apply a primary force 360 against the force distributor ring 330 to deform the deformable optical element 344 to actuate the optical lens assembly 300. Deformation of the deformable optical element 344 may change at least one optical property of the deformable optical element 344 and of the optical lens assembly 300, such as an optical power of the optical lens assembly. The primary actuator(s) 362 may take any of a variety of forms, including an electromechanical actuator, such as a linear actuator, a lever actuator, or a rotational actuator. In some examples, the phrase "primary actuator" may refer to a device or mechanism that is configured to convert an input of electrical energy to a primary force output. The primary actuator 362 may be configured to provide at least an initial force and displacement to the deformable optical element 344. The primary actuator 362 may be configured to apply force to the deformable optical element 344 in any of a variety of ways, including via a force distribution ring (e.g., the force distribution ring 330), via one or more force distribution segments positioned along the outer periphery 320 of the deformable optical element 344, or by directly applying force to the deformable optical element 344 without an intermediary, translating element.

The augmentation mechanism 302 may be a mechanism that is configured to augment the deformation of the deformable optical element 344 by the primary actuator(s) 362. For example, the augmentation mechanism 302 may be configured to apply a secondary force 370 to the deformable optical element 344 through the force distributor ring 330. In some examples, actuation of the augmentation mechanism 302 may be at least partially dependent on actuation of the primary actuator(s) 362. For example, the augmentation mechanism 302 may be a mechanical element or device with stored potential energy (e.g., in a spring or other resilient element) that may be at least partially released upon actuation, but that does not require a direct input of electrical energy for actuation. Actuation of the augmentation mechanism 302 may include changing the augmentation mechanism 302 from a higher potential energy state to a lower potential energy state.

In some examples, the phrase "augmentation mechanism" may refer to a device or mechanism that is configured to provide a secondary force to another element in response to initiation by a primary actuator. Actuation of such augmentation mechanisms may be dependent upon actuation by a primary actuator. The augmentation mechanism 302 may take a variety of forms, including a metallic spring, an elastomeric spring, a composite material spring, a permanent magnet, a pneumatic spring, a hydraulic spring, a flexure element, a lever, and/or an electromagnetic element. In some examples, the term "flexure" may refer to flexible mechanisms used to transfer energy in specified degree(s) of freedom. As opposed to the joints used in rigid mechanisms, transfer in compliant mechanisms may occur through deformation of flexible members. The terms flexure and compliant mechanism may be used interchangeably. In some embodiments, the augmentation mechanism 302 may be or include a magnetic element that may apply the secondary force 370 to the deformable optical element when moved toward another magnetic element. In some examples, the term "magnetic" may refer to an element exhibiting magnetism (e.g., permanent magnets) and/or responding to a magnetic field (e.g., ferromagnetic), and includes electromagnets, permanent magnets, and ferromagnetic materials. Examples of suitable augmentation mechanisms 302 are described below with reference to FIGS. 5-28.

Although the augmentation mechanism 302 is illustrated in FIG. 3 as applying a downward secondary force 370 on the force distributor ring 330, embodiments of the disclosure are not so limited. For example, in some embodiments, the augmentation mechanism 302 may be positioned and configured to apply an upward (from the perspective of FIG. 3) force on the force distributor ring 330, or both an upward and a downward force on the force distributor ring 330. Application of an upward (from the perspective of FIG. 3) force on the force distributor ring 330 may result in the deformable optical element 344 having a concave lens shape.

By including the augmentation mechanism 302 in the optical lens assembly 300, the deformable optical element 344 may be deformed by both the primary actuator 362 and the augmentation mechanism 302. Because the augmentation mechanism 302 may apply some of the required load, for the same amount of deformation of a given deformable optical element 344, the primary actuator 362 may not be required to have the same force capabilities, displacement capabilities, and/or size. Accordingly, the presence of the augmentation mechanism 302 may, in some embodiments, reduce the size and/or weight of the primary actuator 362, and ultimately of the optical lens assembly 300 or an associated HMD. Alternatively, the primary actuator 362 may have the same size, but a maximum deformation of the deformable optical element 344, and therefore an optical power change, may increase due to the presence of the augmentation mechanism 302.

Figure 4:
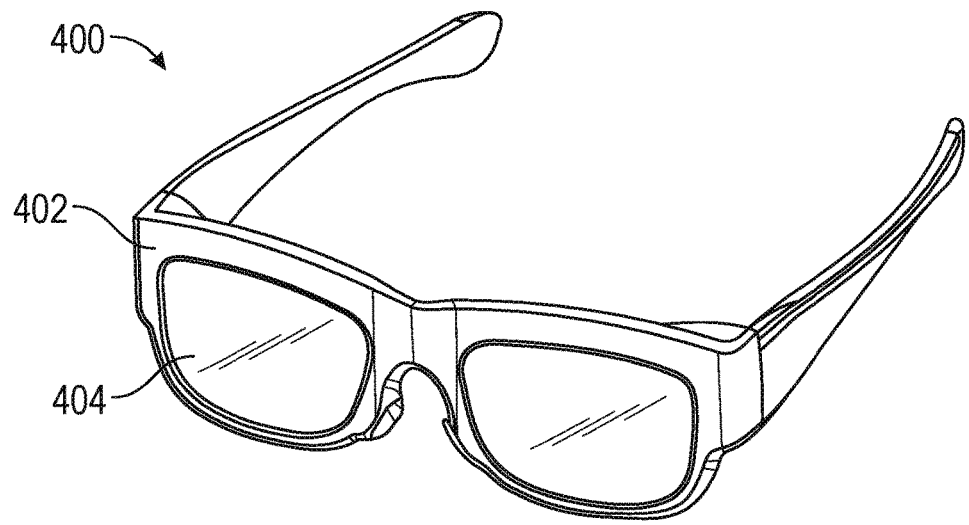
FIG. 4 is a perspective view of a head-mounted display according to some embodiments of the present disclosure.

FIG. 4 illustrates an example HMD 400 (e.g., AR glasses, VR glasses) capable of incorporating the optical lens assemblies described herein. In one example, the HMD 400 may be dimensioned to be worn on a head of a user. The HMD 400 may include a frame element 402 for supporting at least one deformable optical lens assembly 404 according to the present disclosure. For example, the optical lens assembly (ies) 404 may be or include the optical lens assembly 300 of FIG. 3, or another optical lens assembly described in this disclosure. In some embodiments, the optical lens assembly (ies) 404 may be tailored to or selected in consideration of a particular user's eye. In addition to supporting the optical lens assembly(ies) 404, the frame element 402 may also support other elements, such as a primary actuator, a driver circuit for the primary actuator, a power supply element (e.g., a battery), a communication component (e.g., a component for communication via Wi-Fi, BLUETOOTH, near-field communications ("NFC"), etc.), a display element, a graphics processing unit for rendering an image on the display element, an image sensor (e.g., a camera), an eye-tracking element, etc. In addition, the HMD 400 may have a different shape and design than is shown in FIG. 4, such as in the form of a VR headset or another shape that suits user preferences or a particular application.

Figure 5:
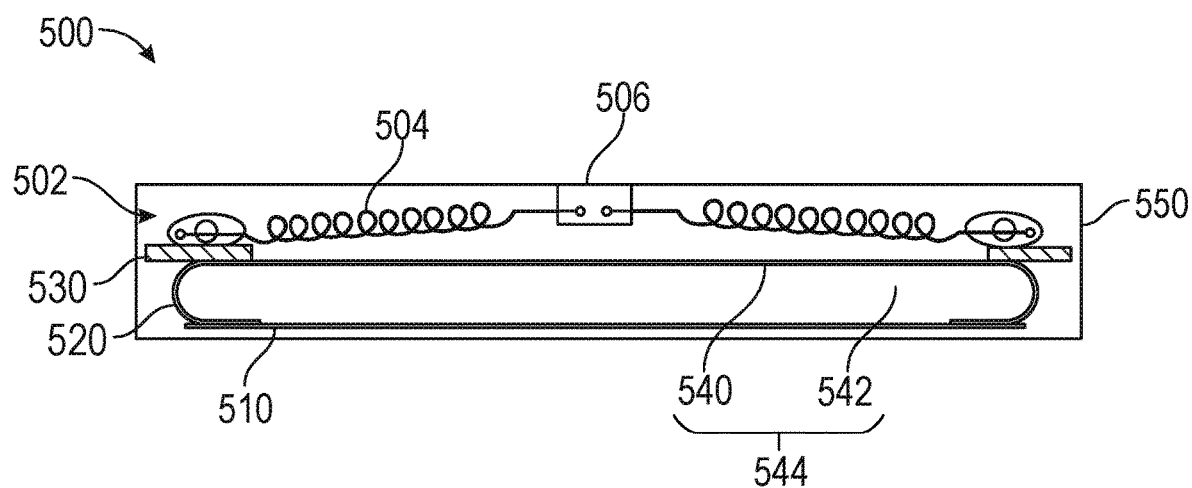
FIG. 5 is a cross-sectional side view of an optical lens assembly in a neutral, non-actuated state, according to another embodiment of the present disclosure.

The augmentation mechanisms described herein may augment the force applied by a primary actuator in a variety of ways using a variety of techniques. FIG. 5 illustrates one such example. As shown in this figure, an optical lens assembly 500 in a non-actuated state with an augmentation mechanism including a rotatable cam 502 and a spring 504 for augmenting deformation of a deformable optical element 544 (including a deformable element 540 and a deformable medium 542) by a primary actuator (e.g., an electromechanical actuator). In this example, the optical lens assembly 500 may include a support element 510 coupled to a peripheral region 520 of the deformable element 540. The cam 502 may abut against a force distributor ring 530 coupled to the peripheral region 520 of the deformable element 540. A housing 550 may support the other components of the optical lens assembly 500.

Figure 6:
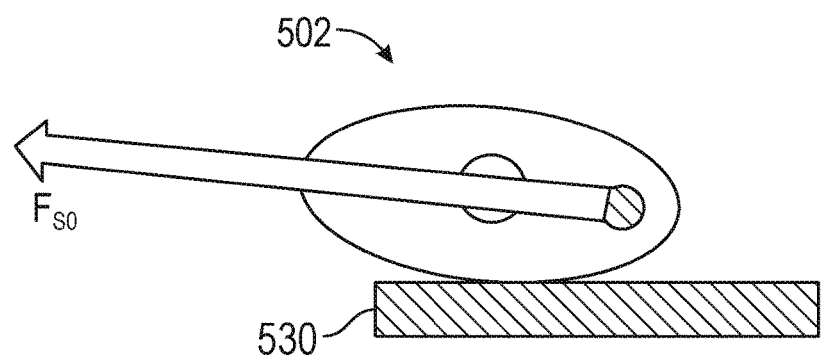
FIG. 6 is a detailed view of an augmentation mechanism of the optical lens assembly of FIG. 5.

As shown in FIG. 6, in the neutral, non-actuated state, the cam 502 may be orientated with the spring 504 and a resulting spring force $F_{S0}$ aligned with a pivot of the cam 502, such that substantially no torque acts on the cam 502 from the spring 504. The spring 504 may initially be in a stretched condition between an outer portion of the cam 502 and a spring attachment structure 506 of the housing 550. The neutral, non-actuated state may be an unstable state of the cam 502, with potential energy stored in the stretched spring 504.

Figure 7:
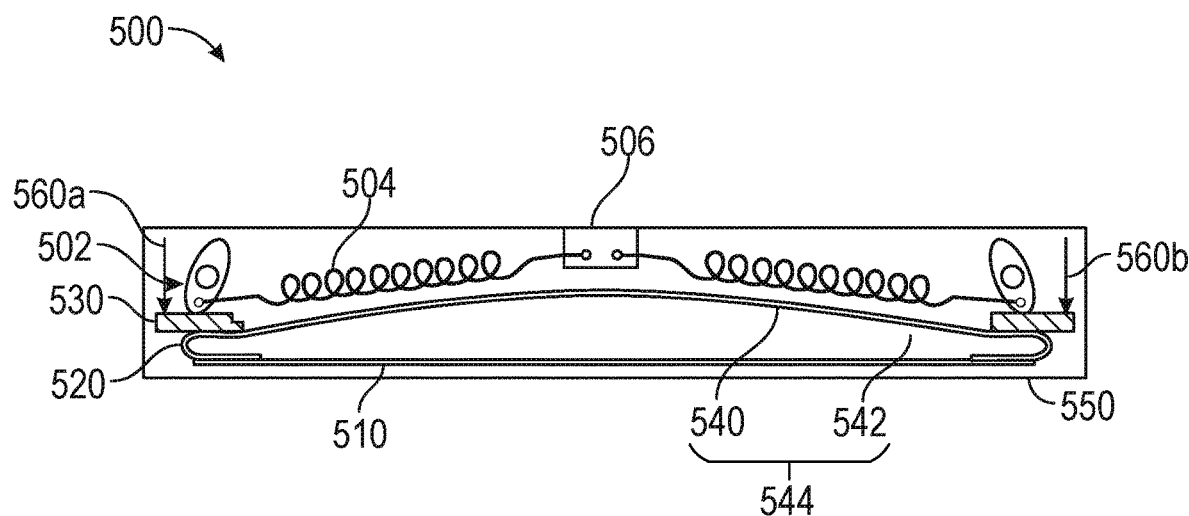
FIG. 7 is a cross-sectional side view of the optical lens assembly of FIG. 5 in an actuated state.
Figure 8:
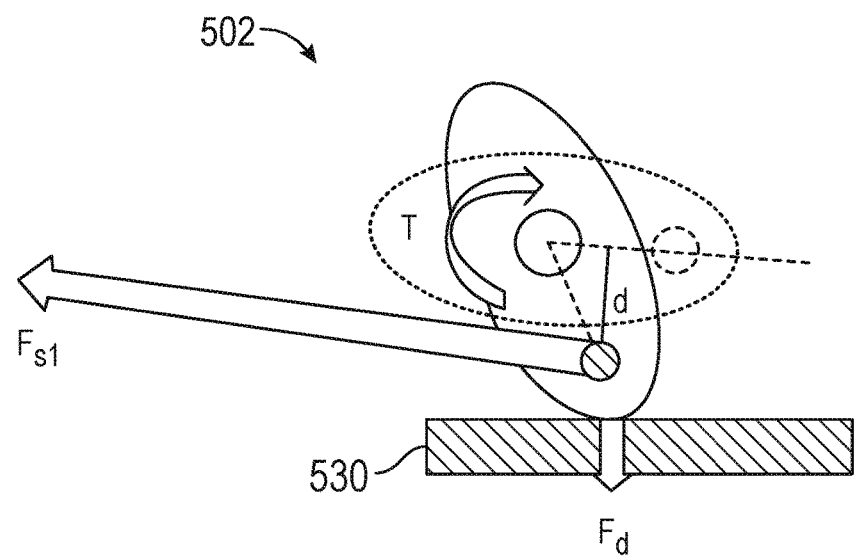
FIG. 8 is a detailed view of the augmentation mechanism of FIG. 6 in the actuated state.

Referring to FIGS. 7 and 8, as the primary actuator is actuated and begins to displace the force distributor ring 530 by applying one or more forces 560a, 560b, the cam 502 may rotate about its pivot, creating a moment arm d (FIG. 8) between the spring attachment structure 506 and the pivot of the cam 502. The spring force $F_{S1}$ acting on the moment arm d will apply a torque T (FIG. 8) to the cam 502, resulting in the application of a secondary force $F_d$ (FIG. 8) on the force distributor ring 530. As the displacement of the force distributor ring 530 increases, the moment arm d may become larger. Accordingly, the secondary force $F_d$ applied to the force distributor ring 530 may, in some embodiments, increase during actuation. There may be some drop in the spring force $F_{S1}$ (compared to the initial spring force $F_{S0}$) as a stretched length of the spring 504 is reduced during actuation, but the increasing moment arm d may compensate so that the overall secondary force $F_d$ of the augment mechanism may decrease less, be the same, or increase during downward (from the perspective of FIGS. 5-8) stroke of the force displacement ring 530.

The augmentation mechanism may include one rotatable cam 502 and one spring 504, two cams 502 and two springs 504 (as shown in FIGS. 5 and 7), or any other number of cams 502 and springs 504 as may be desired for a given application. For example, additional cams 502 and corresponding springs 504 may be added to apply additional force, or to distribute force from the cams 502 along portions of the force distributor ring 530. The spring(s) 504 may be selected to have a spring constant to apply a desired secondary force to the force distributor ring 530. For example, a higher spring constant may result in a higher secondary force $F_d$, and a lower spring constant may result in a lower secondary force $F_d$. In addition, a shape and configuration of the cam 502 may be selected to apply a desired secondary force and displacement. For example, a placement of a spring connection point on the cam 502 may be moved farther from the pivot point of the cam 502 for a larger force (due to a larger moment arm d) and greater potential displacement. In addition, the secondary force $F_d$ to be applied by the augmentation mechanism may be selected to be less than a return force applied by the deformable optical element 544, such that the optical lens assembly 500 may return to or toward the neutral, non-actuated state upon release or relaxation of the primary force(s) 560a, 560b by the primary actuator.

Figure 9:
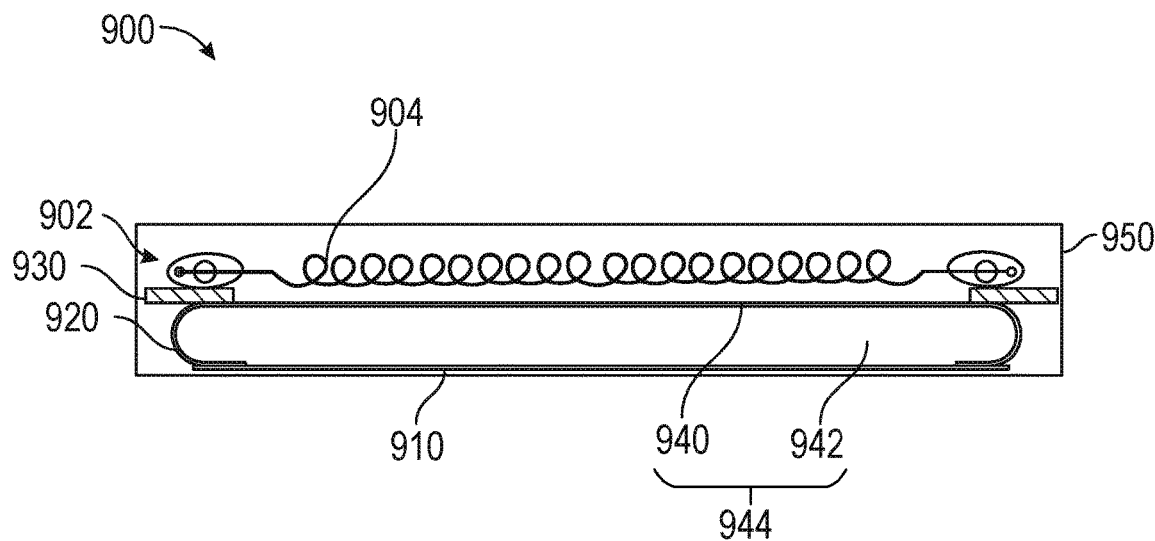
FIG. 9 is a cross-sectional side view of an optical lens assembly in a neutral, non-actuated state, according to another embodiment of the present disclosure.
Figure 10:
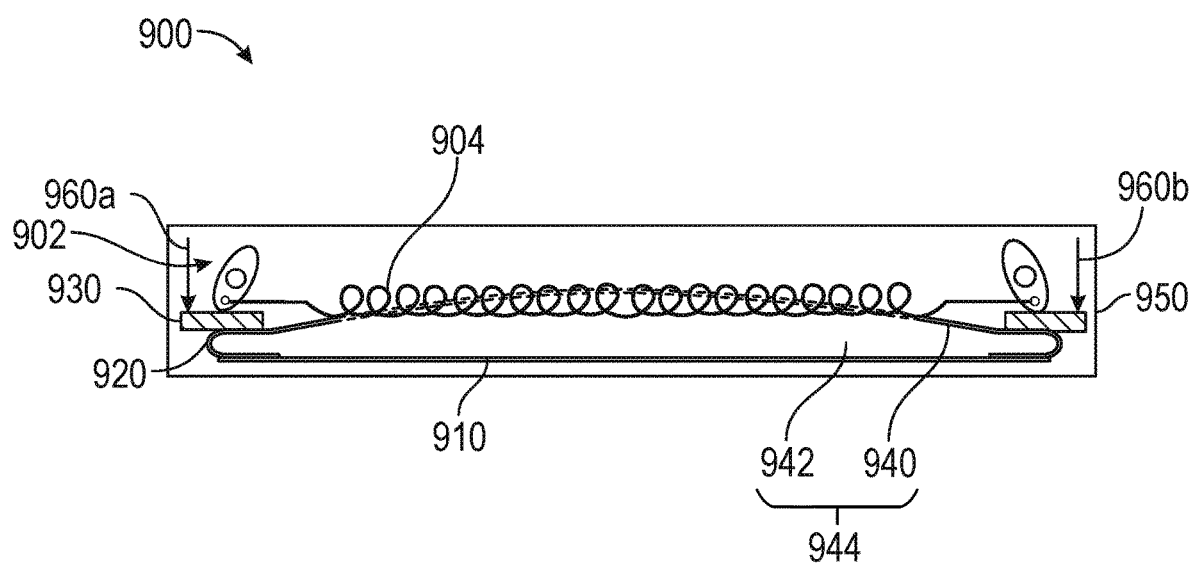
FIG. 10 is a cross-sectional side view of the optical lens assembly of FIG. 9 in an actuated state.

FIGS. 9 and 10 show an embodiment of an optical lens assembly 900 similar to the optical lens assembly 500 described above with reference to FIGS. 5-8, but with a single spring 904 extending directly between two cams 902, rather than between each cam 902 and a spring attachment structure of a housing 950. The optical lens assembly 900 may include a support element 910 coupled to and supporting a deformable optical element 944 including a deformable element 940 and deformable medium 942. A force distribution ring 930 may be coupled to the deformable element 940 at a peripheral region 920 thereof. The optical lens assembly 900 may operate in a similar fashion to the optical lens assembly 500 described above. However, upon application of a force 960a, 960b by a primary actuator, the configuration of the optical lens assembly 900 shown in FIGS. 9 and 10 may balance the secondary force applied by and between the cams 902 on the force distributor drive ring 930, and ultimately on the deformable element 940, should such balancing be desired for some applications. The spring 904 may be positioned along the peripheral region 920 of the deformable optical element 944, and may be covered by the housing 950.

Figure 11:
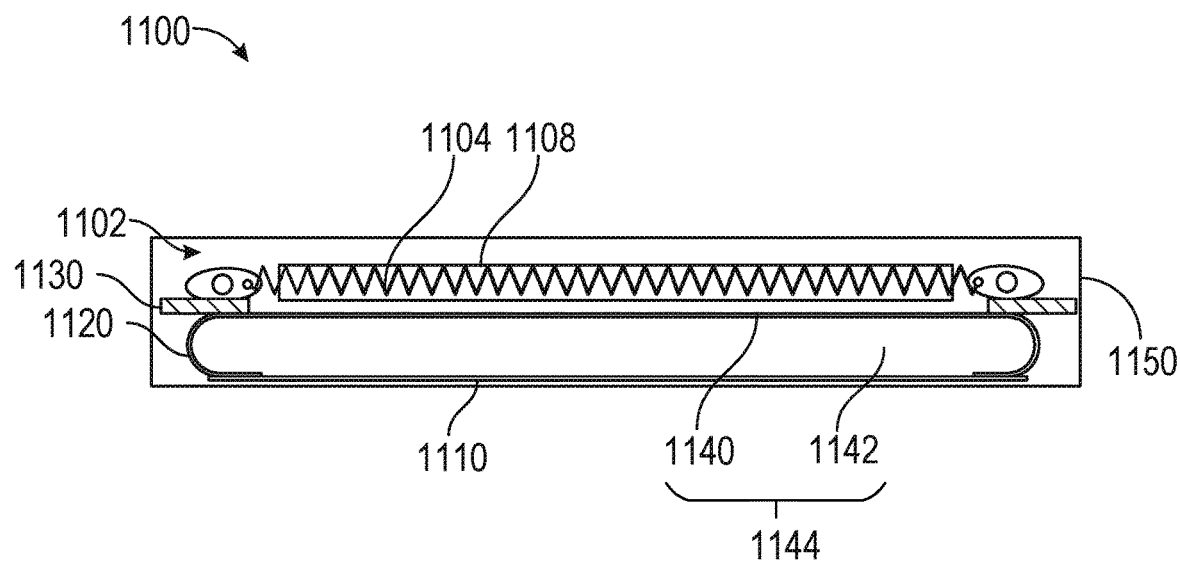
FIG. 11 is a cross-sectional side view of an optical lens assembly in a neutral, non-actuated state, according to another embodiment of the present disclosure.
Figure 12:
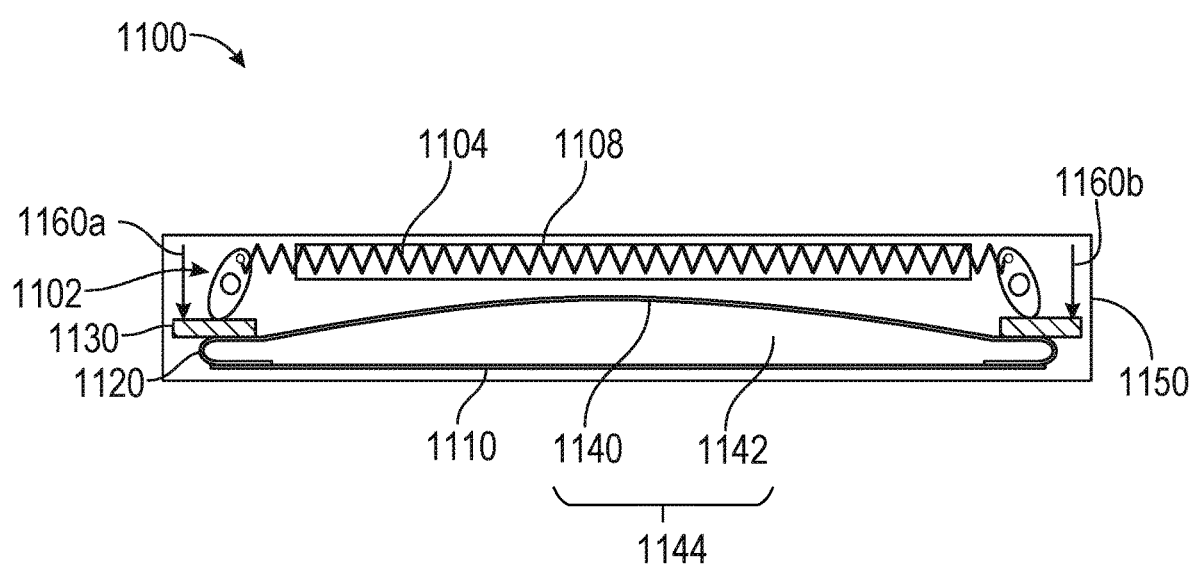
FIG. 12 is a cross-sectional side view of the optical lens assembly of FIG. 11 in an actuated state.

FIGS. 11 and 12 show an embodiment of an optical lens assembly 1100 similar to the optical lens assembly 500 described above with reference to FIGS. 5-8, but with a single compression spring 1104 between the cams 1102. In this example, the optical lens assembly 1100 may include a support element 1110 coupled to and supporting a deformable optical element 1144 including a deformable element 1140 and a deformable medium 1142. A force distribution ring 1130 may be coupled to the deformable element 1140 at a peripheral region 1120 thereof. An augmentation mechanism may include the cams 1102 and the compression spring 1104. A tube 1108 may be positioned at least partially around the spring 1104 to inhibit buckling of the compressing spring 1104. The compression spring 1104 may extend between inner portions of the cams 1102.

As shown in FIG. 12, upon application of a primary force 1160a, 1160b on the force distributor ring 1130 by a primary actuator, the spring 1104 may move upward relative to the housing 1150 as the spring 1104 applies a spring force to the cams 1102. Like the embodiment described above with reference to FIGS. 9 and 10, the compression spring 1104 of FIGS. 11 and 12 may balance a spring force between the cams 1102 to control deformation of the deformable element 1140.

Figure 13:
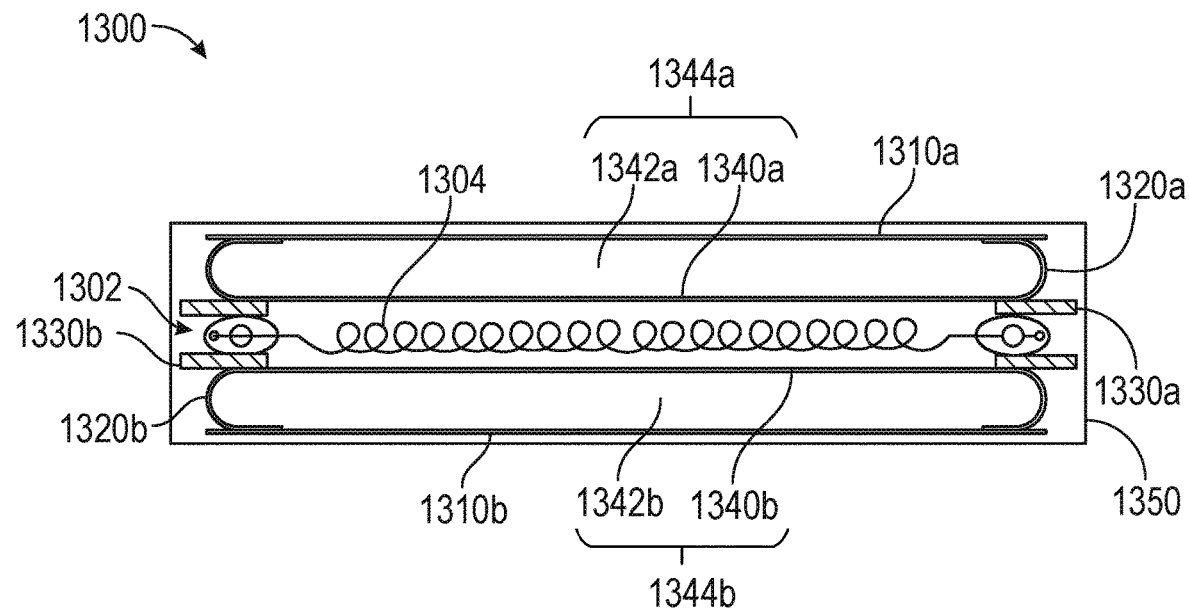
FIG. 13 is a cross-sectional side view of an optical lens assembly in a neutral, non-actuated state, according to another embodiment of the present disclosure.
Figure 14:
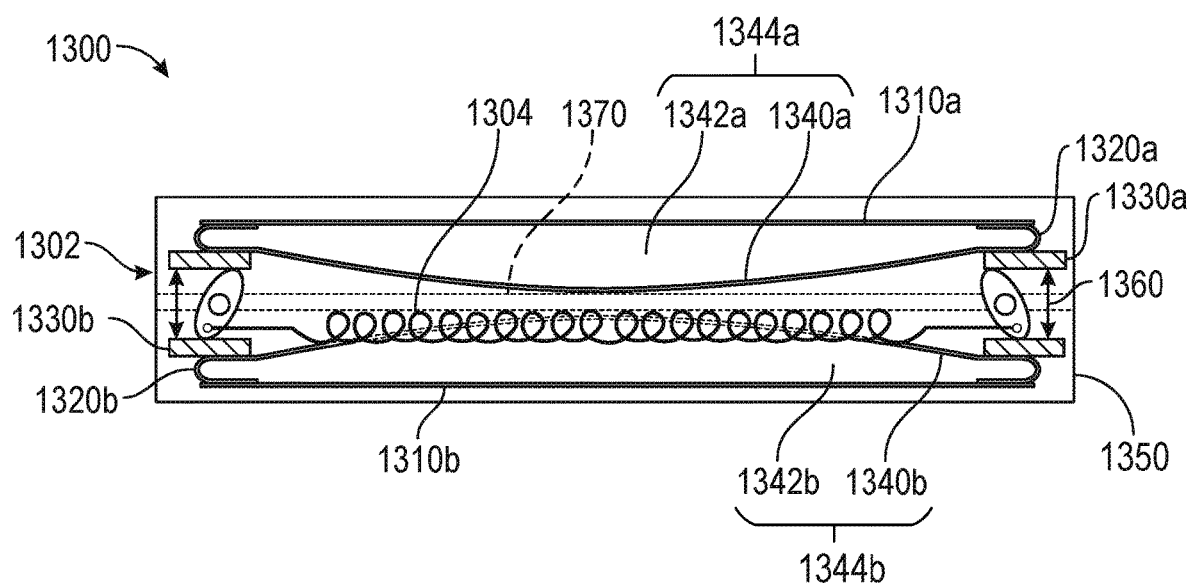
FIG. 14 is a cross-sectional side view of the optical lens assembly of FIG. 13 in an actuated state.

FIGS. 13 and 14 show an embodiment of an optical lens assembly 1300 similar to the optical lens assembly 500 described above with reference to FIGS. 5-8, but with two deformable elements 1340a, 1340b that are configured to be simultaneously actuated as a pair. For example, the optical lens assembly 1300 may be actuated using a cam 1302 and spring 1304 system. The optical lens assembly 1300 may include first and second support elements 1310*a*, 1310*b*, first and second deformable optical elements 1344*a*, 1344*b* respectively including first and second deformable elements 1340*a*, 1340*b* and first and second deformable media 1342*a*, 1342*b*, a first force distributor ring 1330*a* coupled to a peripheral region 1320*a* of the first deformable element 1340*a*, and a second force distributor ring 1330*b* coupled to a peripheral region 1320*b* of the second deformable element 1340*b*. A display element 1370, shown in dashed lines in FIG. 14, may be positioned between the first deformable optical element 1344*a* and the second deformable optical element 1344*b*. A housing 1350 may support the other components of the optical lens assembly 1300.

The spring 1304 may extend directly between two cams 1302, as shown in FIGS. 13 and 14 or, alternatively, may extend between each cam 1302 and a spring attachment structure as described above with reference to FIGS. 5-8. In the optical lens assembly 1300, the two separate force distributor rings 1330*a*, 1330*b* may be configured to move in opposite directions during actuation to augment a force 1360 from a primary actuator (e.g., an electromechanical actuator) and to deform the two deformable elements 1340*a*, 1340*b*, as shown in FIG. 14. Alternatively, in some embodiments, the primary actuator and the cam 1302 may be positioned and configured to simultaneously move the force distributor rings 1330*a*, 1330*b* in the same direction (e.g., upward together or downward together, from the perspective of FIGS. 13 and 14).

In some examples, the optical lens assembly 1300 illustrated in FIGS. 13 and 14 may be used to reduce or eliminate the negative impact of a phenomenon known as the "vergence-accommodation conflict." Traditional augmented-reality displays may attempt to create the illusion that a virtual object is set at a distance in the real-world environment by displaying virtual images to the left eye and to the right eye with a relative offset, such that a user's eyes converge on the desired real-world focal point to align the left- and right-side virtual images. At the same time, the user's left and right eyes also undergo accommodation to bring the respective left- and right-side virtual images into focus. However, the distance of the real-world focal point may frequently differ from the distance of the augmented-reality display, causing a difference between the apparent vergence distance and the apparent accommodation distance of a virtual object. Unfortunately, because the human visual system is adapted to the expectation that the apparent vergence distance and the apparent accommodation distance of a real-world object will match, the mismatch frequently posed by traditional augmented reality systems may confuse a user's vision, potentially breaking a sense of immersion—or even causing severe physical discomfort.

The optical lens assembly 1300 illustrated in FIGS. 13 and 14 may be configured to address the vergence-accommodation conflict. For example, the first deformable optical element 1344*a* may be positioned on a side of the display element 1370 proximate a user's eye, and the second deformable optical element 1344*b* may be positioned on a side of the display element 1370 opposite the user's eye. In this example, the first deformable optical element 1344*a* may be configured to adjust the user's view of an image rendered on the display element 1370. The second deformable optical element 1344*b* may be configured to counteract the adjustments of the first deformable optical element 1344*a* with respect to the user's view of a surrounding real-world environment. In other words, the two deformable optical elements 1344*a*, 1344*b* may together modify the apparent accommodation distance of a virtual object or scene shown on the display element 1370, while reducing or eliminating any distortion of the appearance of the real-world environment through the optical lens assembly 1300.

FIGS. 15-18 show an embodiment of an optical lens assembly 1500 using a buckling spring element 1504 configured to buckle to apply a secondary force against a force distribution drive ring 1530 to deform a deformable optical element 1544 including a deformable element 1540 and a deformable medium 1542. The optical lens assembly 1500 may include a support element 1510 coupled to the deformable optical element 1544 at a peripheral region 1520 of the deformable element 1540. The components of the optical lens assembly 1500 may be supported by a housing 1550 (e.g., a frame element). The buckling spring element 1504 may be or include a spring element that is initially in compression, torsion, or flexure, for example.

Figure 15:
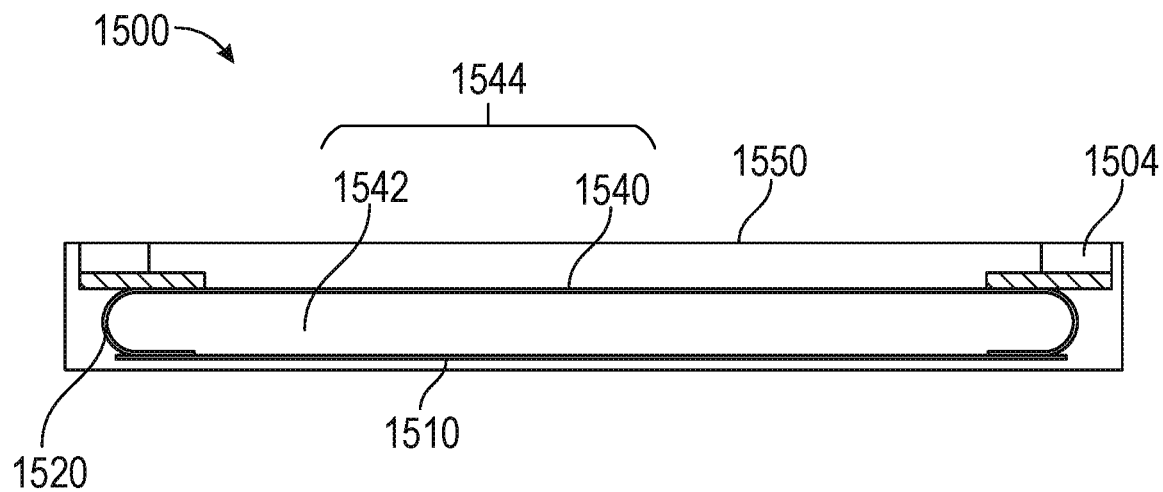
FIG. 15 is a cross-sectional side view through a central portion of an optical lens assembly in a neutral, non-actuated state according to another embodiment of the present disclosure.
Figure 16:
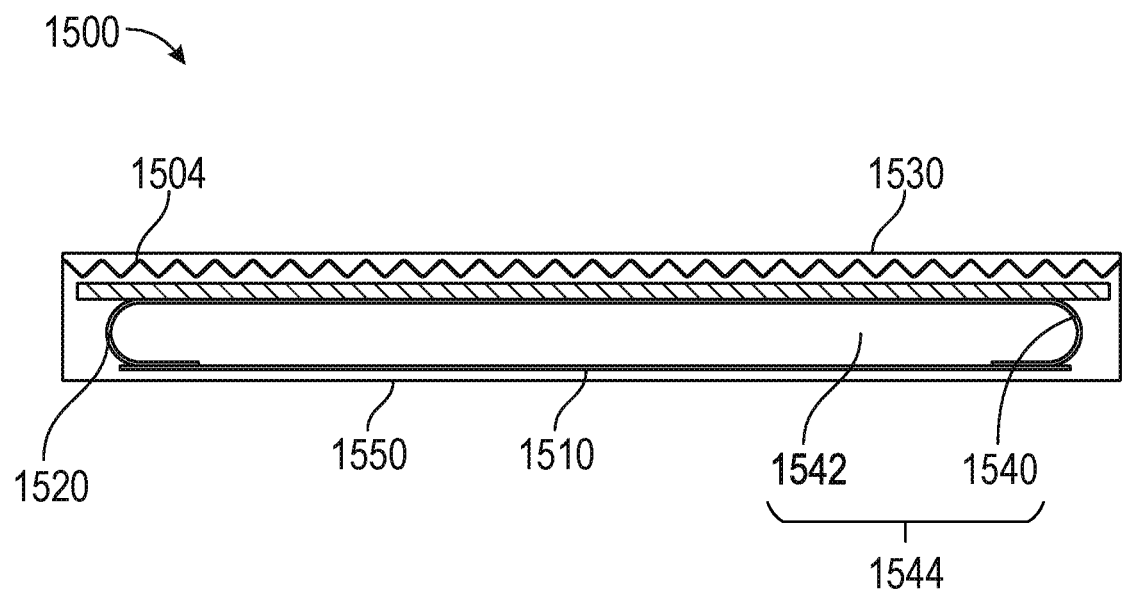
FIG. 16 is a cross-sectional side view from an edge portion of the optical lens assembly of FIG. 15.
Figure 17:
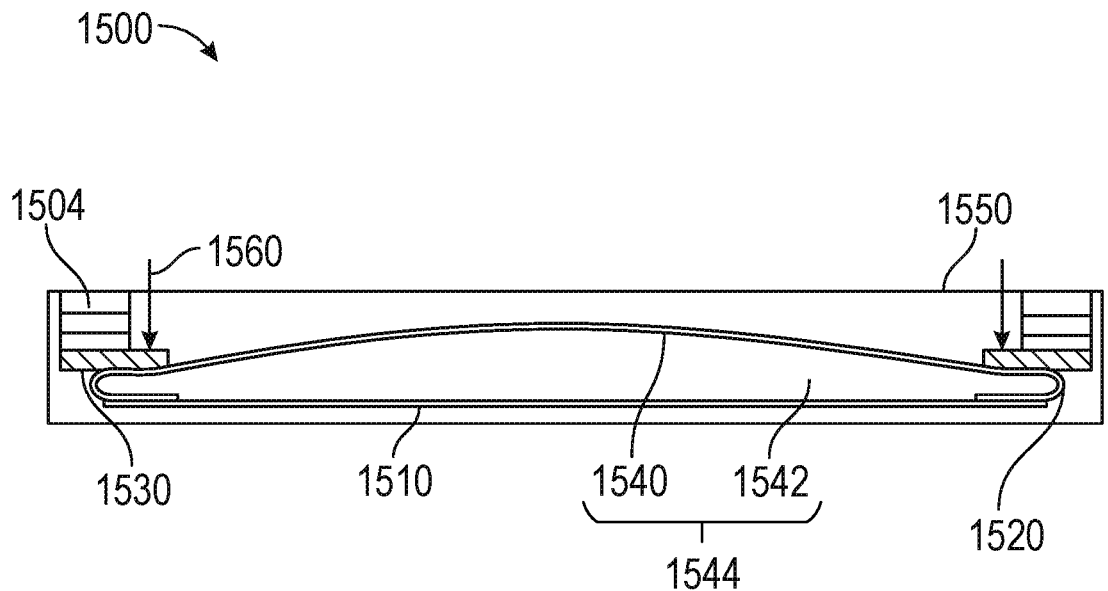
FIG. 17 is a cross-sectional side view through the central portion of the optical lens assembly of FIG. 15 in an actuated state.
Figure 18:
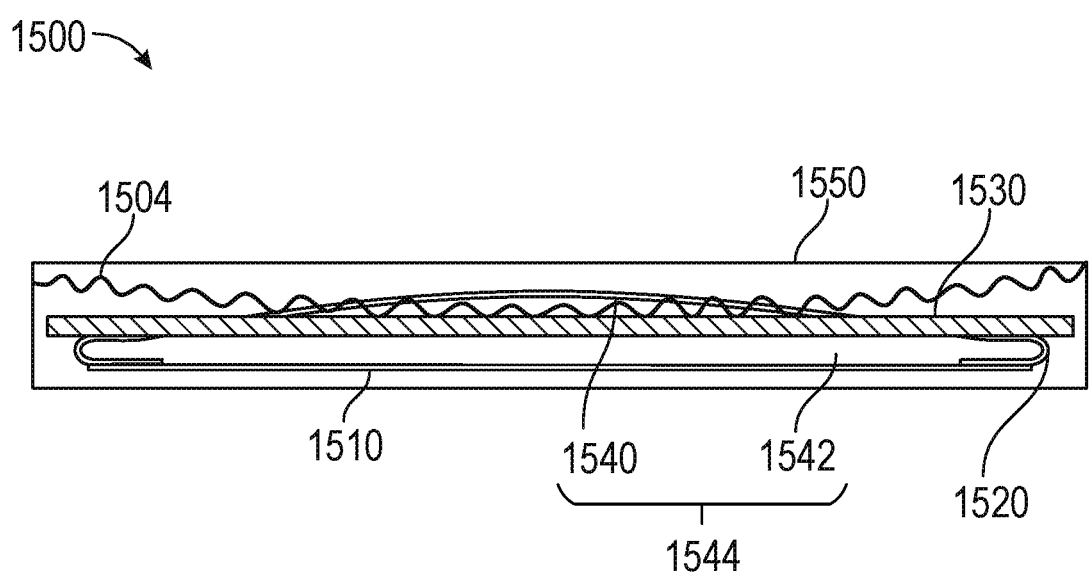
FIG. 18 is a cross-sectional side view from the edge portion of the optical lens assembly of FIG. 16.

FIGS. 15 and 16 illustrate the optical lens assembly 1500 in a neutral, non-actuated state. FIGS. 17 and 18 illustrate the optical lens assembly 1500 in an actuated state. FIGS. 15 and 17 show a cross-sectional side view through a central portion of the optical lens assembly 1500. FIGS. 16 and 18 show a cross-sectional side view from an edge portion of the optical lens assembly 1500.

During actuation by a primary force 1560 from a primary actuator (e.g., an electromechanical actuator), the buckling spring element 1504 may apply a secondary force to the force distributor ring 1530 to augment the primary force 1560. In the non-actuated state, the buckling spring element 1504 may be axially compressed (i.e., along a length of the buckling spring element 1504), since its neutral (e.g., uncompressed) length is longer than a space in the housing 1550 containing the buckling spring element 1504. The buckling spring element 1504 may be laterally constrained by the force distributor ring 1530 and the housing 1550. The buckling spring element 1504 may be selected such that its elastic section modulus (geometry) and Young's modulus result in elastic buckling of the spring 1504 in one plane when unconstrained from the sides. Upon actuation, as the primary actuator displaces the force distributor ring 1530 with the primary force 1560, the buckling spring element 1504 may continue to buckle with an increasing force toward an equilibrium condition, thereby applying an increasing secondary force on the force distributor ring 1530.

Figure 19:
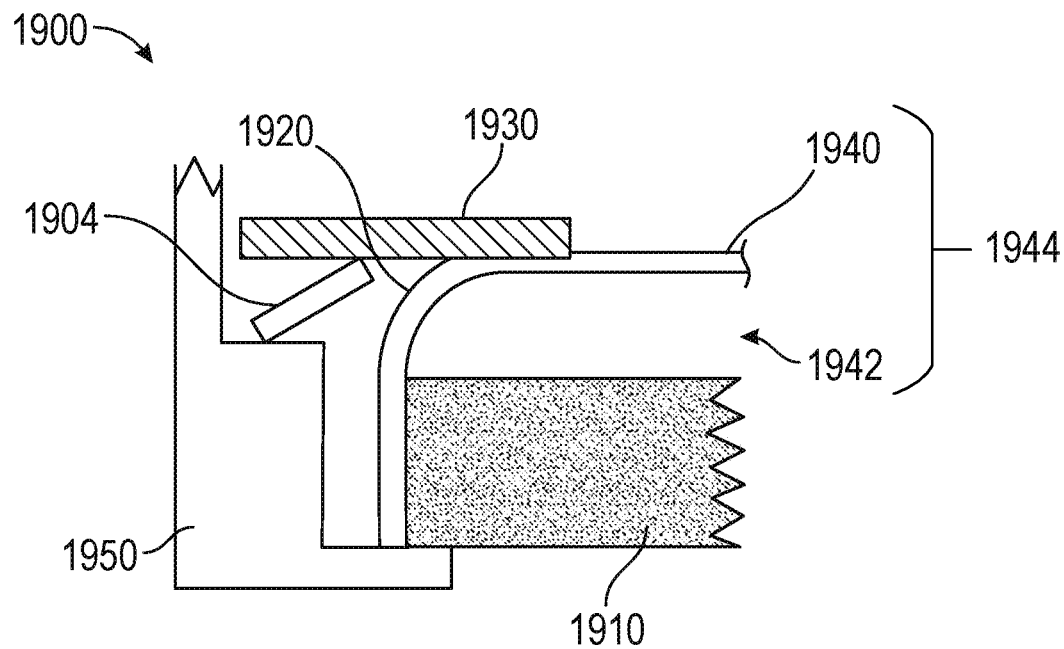
FIG. 19 is a partial cross-sectional side view of an optical lens assembly in a neutral, non-actuated state according to another embodiment of the present disclosure.
Figure 20:
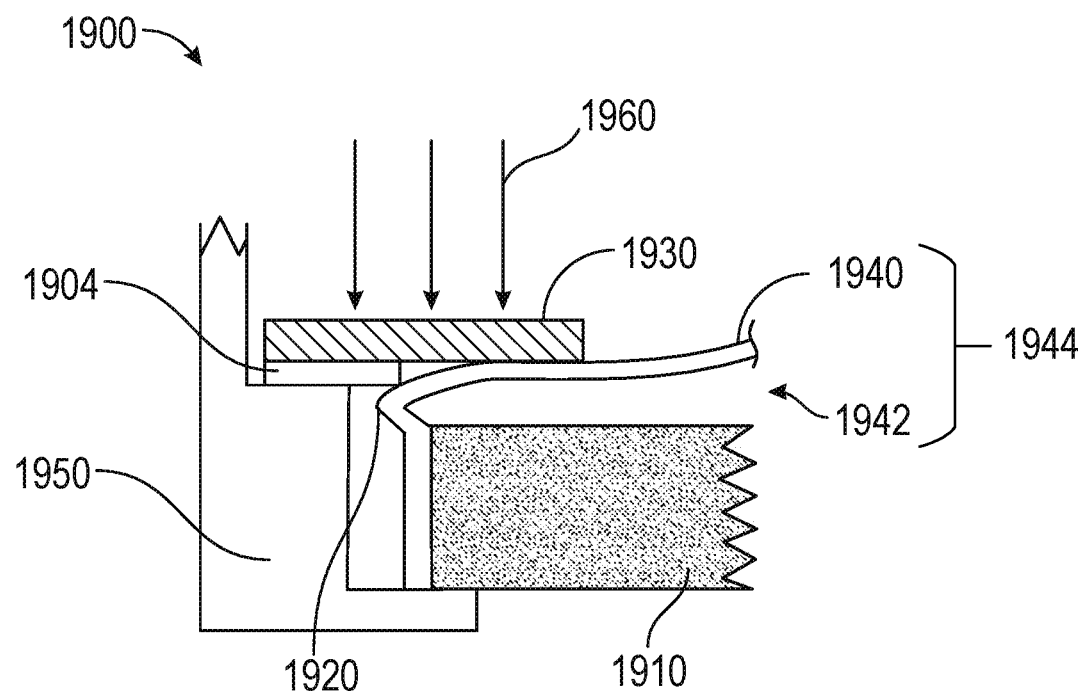
FIG. 20 is a partial cross-sectional side view of the optical lens assembly of FIG. 19 in an actuated state.

FIGS. 19 and 20 show an embodiment of an optical lens assembly 1900 in which a nonlinear disk spring 1904 may be mounted in a housing 1950 adjacent to a peripheral region 1920 of a deformable element 1940. In some examples, the term "nonlinear" may refer to a nonlinear force-displacement curve, which may result in load-dependent stiffness. A force distributor ring 1930 may be positioned over both the disk spring 1904 and the peripheral region 1920 of the deformable element 1940. The optical lens assembly 1900 may also include a support element 1910 and a deformable optical element 1944 including the deformable element 1940 and a deformable medium 1942.

The disk spring may be configured to act in parallel to a deformation load from deforming the deformable optical element 1944. A relationship between force and displacement in the disk spring 1904 may be a cubic function that depends on its geometry, including thickness, height, and disk radius. For the primary actuator to see a sufficient force reduction, the disk spring 1904 may be selected or designed to achieve a negative spring constant near maximum stroke, which, when placed in parallel to the deformation load, may result in a leveling off or reduction in the actuator load requirement, as illustrated in FIG. 21.

Figure 21:
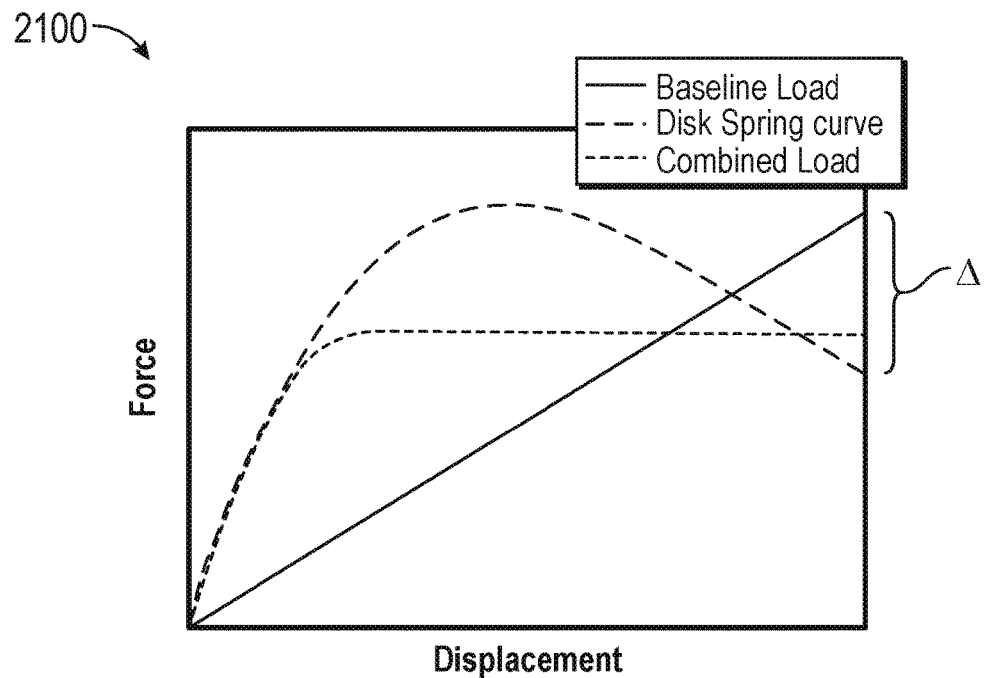
FIG. 21 is a graph showing displacement of and force applied to a force distributor ring of an optical lens assembly according to embodiments of the present disclosure.

FIG. 21 shows a plot 2100 of an example deformation load without augmentation (solid black line), an example nonlinear disk spring curve (long dashed line), and an example combined load (short dashed line) taking into consideration both the deformation load and disk spring curve. In this example, a force reduction A may be achieved at maximum stroke (e.g., at the state illustrated to the right of the plot 2100 of FIG. 20).

FIGS. 19 and 20 show the states of the spring 1904 and deformable optical element 1944 along the peripheral region 1920 of the deformable element 1940 when no load and a maximum primary force 1960 are applied by a primary actuator, respectively. In the neutral, non-actuated state, the disk spring 1904 may be in its equilibrium, coned disk shape as shown in FIG. 19. The state shown in FIG. 19 corresponds to a leftmost point on the loading curve of FIG. 23. The state shown in FIG. 20 corresponds to a rightmost point on the loading curve of FIG. 21. At maximum stroke, the disk spring 1904 may be substantially planar after compression by the primary force 1960, and the deformable element 1940 may be deformed to result in a convex lens shape.

Figure 22:
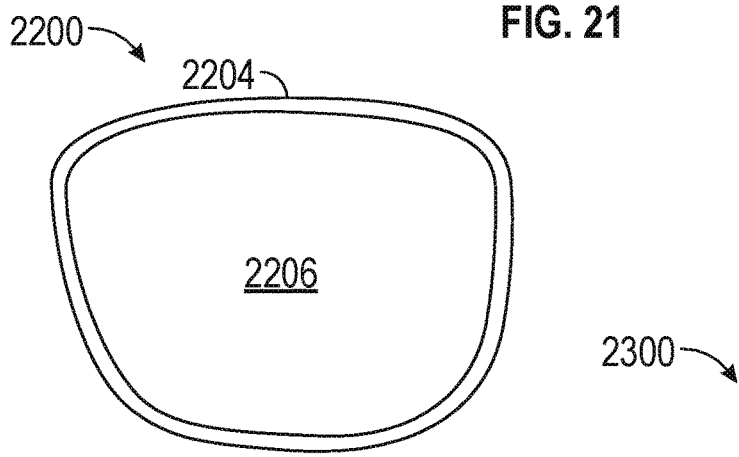
FIG. 22 is a plan view of an optical lens assembly according to an embodiment of the present disclosure.
Figure 23:
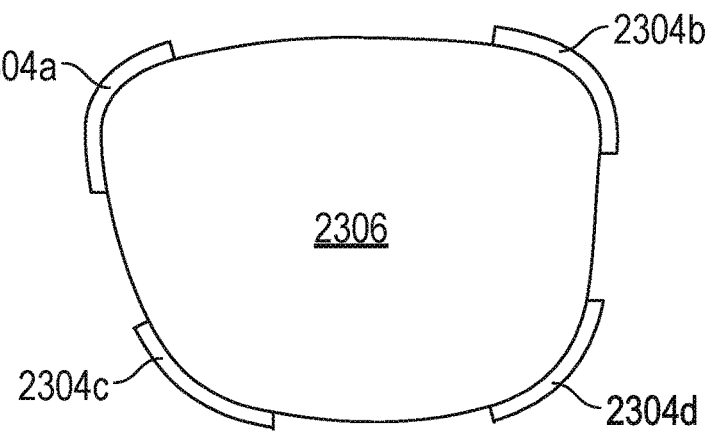
FIG. 23 is a plan view of an optical lens assembly according to another embodiment of the present disclosure.

FIGS. 22 and 23 show top views of optical lens assemblies 2200, 2300 including a disk spring 2204, 2304 (like the disk spring 1904 of FIG. 19) positioned along a peripheral edge of a deformable optical element 2206, 2306. FIG. 22 shows a continuous contour disk spring 2204 mounted along an edge of an optical lens assembly 2200. Since the curvature of the disk spring 2204 may not be constant in an asymmetric optical lens assembly 2200, the deflection under loading may vary locally (i.e., at different locations along a length of the disk spring 2204). FIG. 23 shows an alternative approach where disk springs 2304a, 2304b, 2304c, 2304d are positioned along only portions of the edge of the optical lens assembly 2300. Since loading is geometrically dependent, the application of sections of the disk springs 2304a, 2304b, 2304c, 2304d allows for the effective diameter of the disk springs 2304a, 2304b, 2304c, 2304d to be more widely varied than in the continuous contoured edge spring design (e.g., as shown in FIG. 22). Sections of the disk springs 2304a, 2304b, 2304c, 2304d can also be designed with constant curvature so the load and displacement are substantially uniform along an edge of the spring(s) 2304a, 2304b, 2304c, 2304d.

Non-uniform edge loading and displacement may be applied to an asymmetric lens for realizing substantially axisymmetric deflection, such as to achieve high optical quality. Accordingly, the non-uniform loading and displacement from the continuous contour or with a section disk spring design, as discussed above, may be amenable for the optical lens application.

Figure 24:
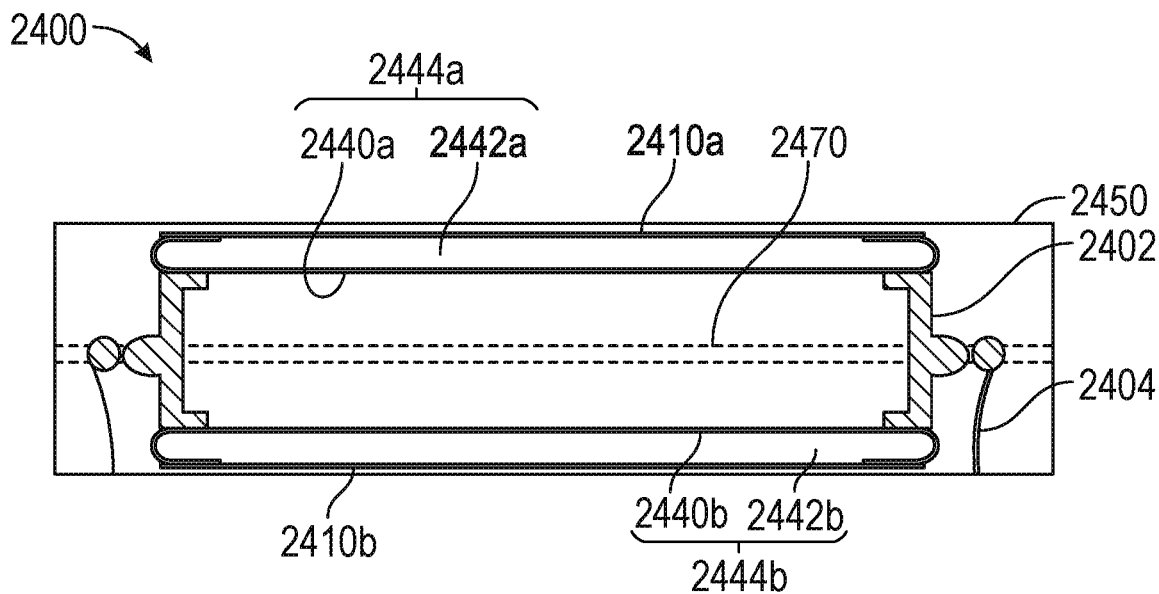
FIG. 24 is a cross-sectional side view of an optical lens assembly in a neutral, non-actuated state according to another embodiment of the present disclosure.
Figure 25:
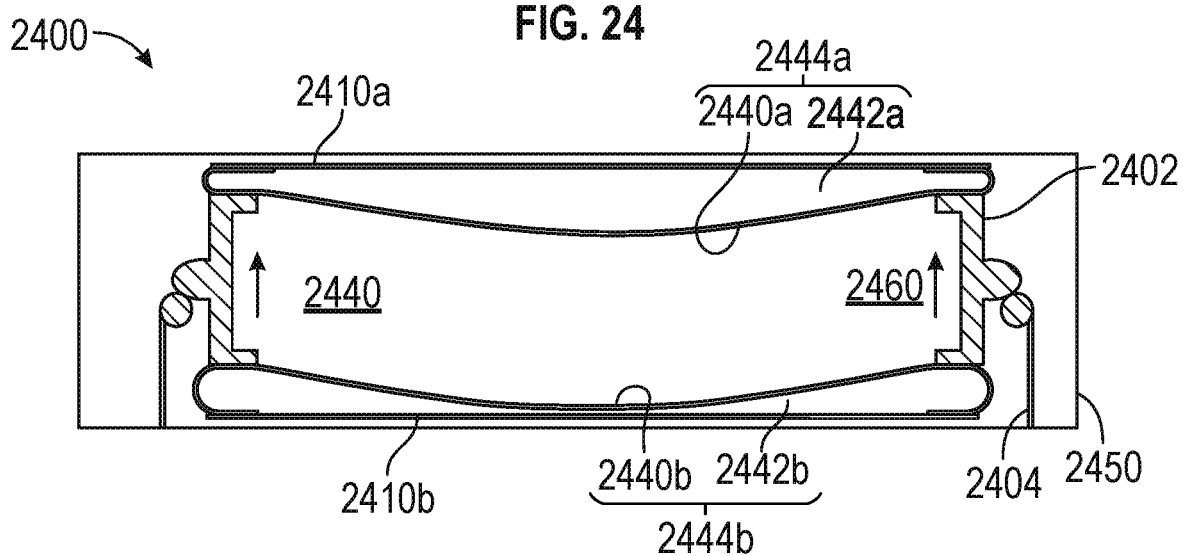
FIG. 25 is a cross-sectional side view of the optical lens assembly of FIG. 24 in a first actuated state.
Figure 26:
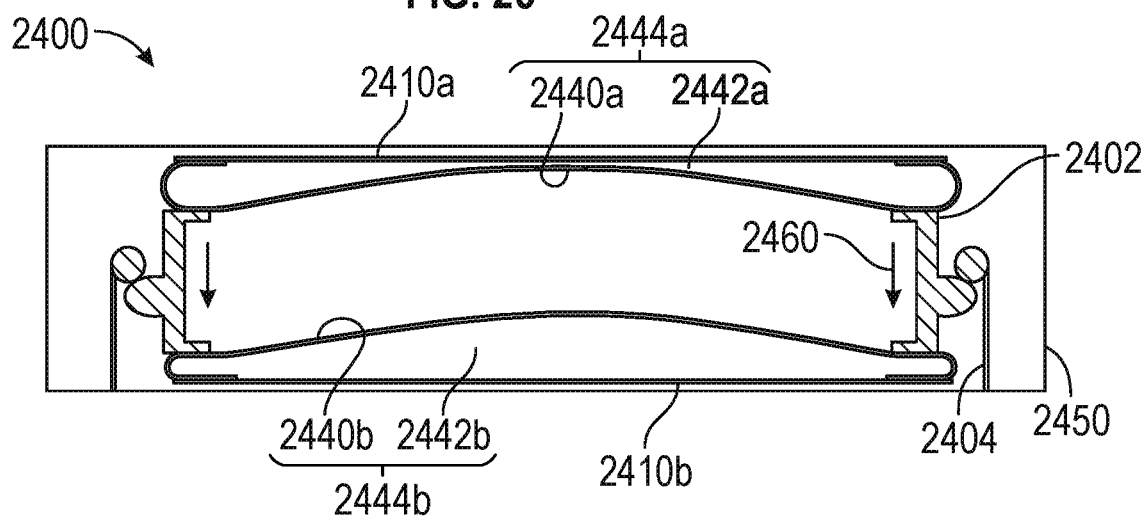
FIG. 26 is a cross-sectional side view of the optical lens assembly of FIG. 24 in a second actuated state.

FIGS. 24-26 show an embodiment of an optical lens assembly 2400 using a rigid shuttle 2402 instead of separate force distributor rings to simultaneously actuate two deformable elements 2440a, 2440b. The optical lens assembly 2400 may include a first deformable optical element 2444a including a first deformable element 2440a and a first deformable medium 2442a. A first support element 2410a may be coupled to and supporting the first deformable optical element 2444a. Similarly, a second deformable optical element 2444b may include a second deformable element 2440b and a second deformable medium 2442b, which may be supported by a second support element 2410b. A display element 2470 may be positioned between the first deformable optical element 2444a and the second deformable optical element 2444b. A toggle spring 2404 may be coupled to a housing 2450 that supports the other components of the optical lens assembly 2400. The toggle spring 2404 may interact with the shuttle 2402 to store potential energy in a neutral, non-actuated state, and to apply a secondary force to the shuttle 2402 when actuated by a primary force 2460 from a primary actuator. For example, the toggle spring 2404 may be flexed and abutted against an outer end surface of a protrusion of the shuttle 2402 in the neutral, non-actuated state. When actuated, the toggle spring 2404 may abut against a side surface of the protrusion of the shuttle 2402 to apply the secondary force to the side surface of the protrusion.

The shuttle 2402 moving in either direction from center may simultaneously deform both of the two deformable elements 2440a, 2440b. As shown in FIG. 25, a first deformable element 2440a may deform into a convex shape and the second deformable element 2440b may simultaneously deform into a concave shape when the shuttle 2402 moves in an upward direction (from the perspective of FIGS. 24-26) upon actuation. Moving the shuttle 2402 in an opposite direction (e.g., downward from the perspective of FIGS. 24-26) off-center has an opposite result, deforming the first deformable element 2440a into a concave shape and the second deformable element 2440b into a convex shape, as shown in FIG. 26. As in other embodiments described above, a primary actuator may be used to initiate actuation by application of the primary force 2460 to the shuttle 2402.

FIG. 24 shows the optical lens assembly 2400 in the neutral, non-actuated state. In this position, the shuttle 2402 may be centered between the two deformable elements 2440a, 2440b, and the toggle spring 2404 may be deflected outward to apply a radial (e.g., inward) force but no axial (e.g., upward or downward in the perspective of FIGS. 24-26) force to the shuttle 2402. The toggle spring 2404 could alternatively be a compression or extension coil spring, in some embodiments. Actuation of the optical lens assembly 2400 in one direction is shown in FIG. 25, after the shuttle 2402 is moved upward. Actuation of the optical lens assembly 2400 in an opposite direction is shown in FIG. 26, after the shuttle 2402 is moved downward. In either case, a contact point of the toggle spring 2404 against the shuttle 2402 may be moved to a different position where the spring force has an axial component on the shuttle 2402, thereby augmenting the primary force 2460 on the shuttle 2402 applied by the primary actuator. In some embodiments, as the shuttle 2402 moves further off-center, the secondary force applied by the toggle spring 2404 may increase. Thus, the toggle spring 2404 may be configured to apply a reduced force to the deformable optical elements 2444a, 2444b in a first position (e.g., close to the central position shown in FIG. 24) between second positions (e.g., the positions shown in FIGS. 25 and 26) in which the toggle spring 2404 applies an increased force to the deformable optical elements 2444a, 2444b.

As with the example illustrated in FIGS. 13-14, the opposite shapes of the first and second deformable optical elements 2444a, 2444b of the optical lens assembly 2400 may provide a desired change in optical property (e.g., an accommodative or an adaptive optical property) relative to the display element 2470 through one of the deformable optical elements 2444a, 2444b, while maintaining a substantially zero-optical power view through both of the deformable optical elements 2444a, 2444b. This configuration may be useful in AR applications, for example, to independently adjust a focus of an image rendered on the display element 2470 while maintaining substantially no optical effect on a user's view of a real-world environment through both of the deformable optical elements 2444a, 2444b.

Figure 27:
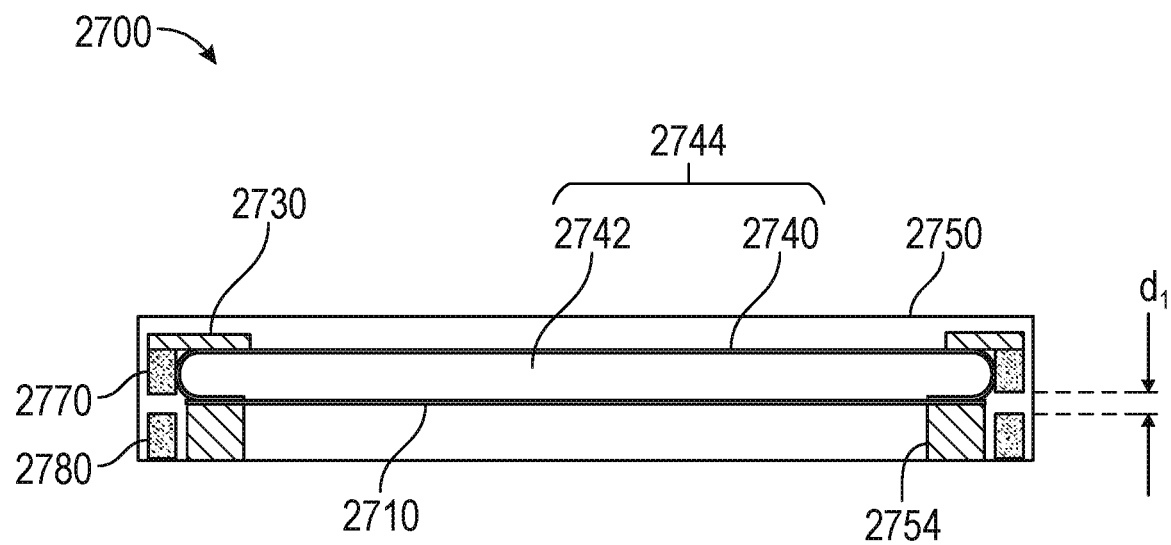
FIG. 27 is a cross-sectional side view of an optical lens assembly in a neutral, non-actuated state according to another embodiment of the present disclosure.
Figure 28:
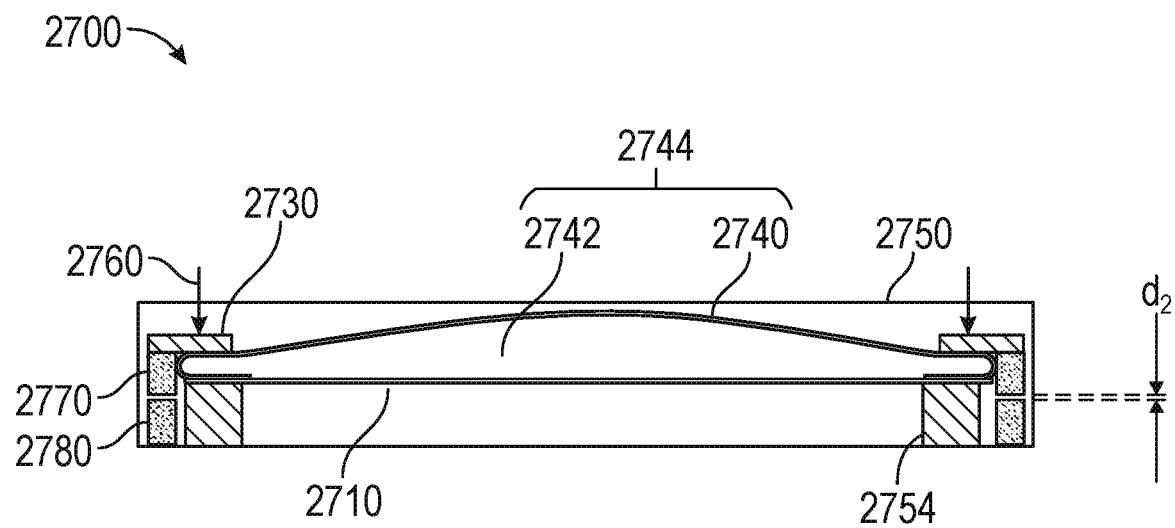
FIG. 28 is a cross-sectional side view of the optical lens assembly of FIG. 27 in an actuated state.
Figure 29:
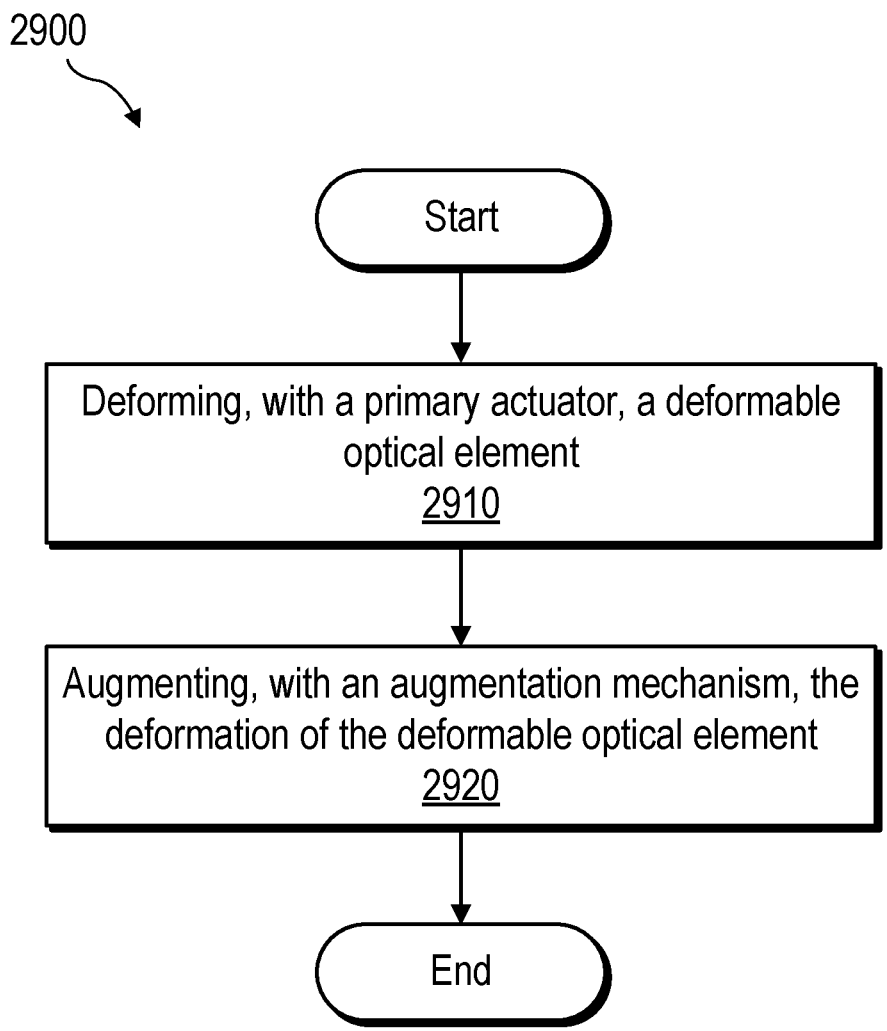
FIG. 29 is a flow chart showing a method of altering optical properties of an optical lens assembly according to some embodiments of the present disclosure.

FIGS. 27 and 28 show an embodiment of an optical lens assembly 2700 using magnetic attraction force to augment deformation of a deformable optical element 2744 from application of a primary force 2760 by a primary actuator. The optical lens assembly 2700 may include a support element 2710, with the deformable optical element 2744 including a deformable element 2740 and a deformable medium 2742, a force distributor ring 2730 coupled to the deformable element 2740, a housing 2750, and a standoff 2754 positioned between the support element 2710 and the housing 2750. In addition, one magnetic element 2770 may be attached to the force distributor ring 2730, and another magnetic element 2780 may be attached to the housing 2750.

In this example, the magnetic attraction force between the magnetic elements 2770, 2780, which corresponds to a secondary force applied on the force distributor ring 2730, may be a function of the distance $d_1$, $d_2$ between the magnetic elements 2770, 2780. As the primary actuator displaces the force distributor ring 2730 with a primary force 2760, the initial distance $d_1$ between the magnetic elements 2770, 2780 gets smaller, and the magnetic attraction force increases. The relationship between magnetic attraction force and the separation distance $d_2$ between the magnetic elements 2770, 2780 may follow a $1/d_2$ nonlinear trend. Accordingly, as the primary force 2760 increases and the separation distance $d_2$ decreases, the magnetic attraction force and, therefore, the secondary force applied to the force distributor ring 2730 by the magnetic element 2770 may increase. The magnetic elements 2770, 2780 may be selected to exhibit an attraction force that is less than a resilient force of the deformable optical element 2744, such that the deformable optical element 2744 may return to its original shape upon release of the primary force 2760.

The standoff 2754 may be present to provide space for the other magnetic element 2780 coupled to the housing 2750. However, in some embodiments, the magnetic elements 2770 and 2780 may be configured or positioned so that the standoff 2754 is omitted. For example, the magnetic element 2770 may be positioned over a top (from the perspective of FIGS. 27 and 28) of the force distributor ring 2730, and the other magnetic element 2780 may be positioned radially outward from the deformable element 2740. In some embodiments, the magnetic element 2770 may replace the force distributor ring 2730.

FIG. 29 is a flow chart illustrating a method 2900 of altering optical properties of an optical lens assembly according to embodiments of the present disclosure. In operation 2910, a deformable optical element may be deformed with a primary actuator (e.g., an electromechanical actuator) to alter an optical property (e.g., an adaptive optical property or an accommodative optical property) of the deformable optical element. For example, a primary force may be applied by the primary actuator to a force distributor ring coupled to the deformable optical element. As a result of the application of the primary force, the deformable optical element may change in shape, such as from a substantially planar shape to a convex or a concave shape. In operation 2920, the deformation of the deformable optical element by the primary actuator may be augmented by an augmentation mechanism. The augmentation mechanism may be changed from a higher potential energy state to a lower potential energy state. For example, any of the augmentation mechanisms described above with reference to FIGS. 3-28 may apply a secondary force to augment the deformation initiated by the primary actuator. The augmentation mechanism may return from the lower potential energy state to the higher potential energy state upon release of the primary force by the primary actuator.

Accordingly, disclosed are optical lens assemblies and associated HMDs that include a deformable optical element that is configured to be deformed by a primary actuator and by an augmentation mechanism, such as a cam, spring, shuttle, and/or magnetic mechanism. The augmentation mechanism may be configured to augment a deformation of the deformable optical element from the primary actuator. In some examples, the augmentation mechanism may be a passive mechanism that is actuated in response to actuation of the primary actuator. As detailed above, this augmentation mechanism may enable the size and/or requirements of the primary actuator to be reduced, which may in turn reduce the weight and/or size of an HMD including the primary actuator. Accordingly, use of augmentation mechanisms according to the present disclosure may improve user comfort for optical lens assemblies and HMDs exhibiting a given change in optical properties, and/or may improve optical properties and capabilities of optical lens assemblies and HMDs including a primary actuator of a given size or type.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical lens assembly, comprising:
   a deformable optical element;
   at least one primary actuator configured to deform, and thus change at least one optical property of, the deformable optical element;
   at least one augmentation mechanism configured to augment the deformation of the deformable optical element by the primary actuator; and
   a housing supporting the deformable optical element, the primary actuator, and the augmentation mechanisms, wherein the housing comprises a frame for a head-mounted display.

2. The optical lens assembly of claim 1, wherein the primary actuator is configured to apply a primary force to deform the deformable optical element, and the augmentation mechanism comprises a cam positioned to apply a secondary force to the deformable optical element.

3. The optical lens assembly of claim 2, wherein the augmentation mechanism further comprises a spring coupled to the cam.

4. The optical lens assembly of claim 3, wherein the spring is further coupled to a spring attachment element of a housing supporting the deformable optical element, the primary actuator, and the augmentation mechanism.

5. The optical lens assembly of claim 3, further comprising another cam positioned to apply another secondary force to the deformable optical element, wherein the spring is further coupled to the other cam.

6. The optical lens assembly of claim 3, wherein the spring is initially in compression, torsion, flexure, or tension in a non-actuated state.

7. The optical lens assembly of claim 6, further comprising a sleeve surrounding at least a portion of the spring.

8. The optical lens assembly of claim 2, further comprising another deformable optical element, wherein the cam is further positioned to apply another secondary force to the other deformable optical element.

9. The optical lens assembly of claim 1, wherein the primary actuator is configured to apply a primary force to deform the deformable optical element, and the augmentation mechanism comprises a spring positioned to apply a secondary force to the deformable optical element.

10. The optical lens assembly of claim 1, wherein the augmentation mechanism comprises a magnetic element.

11. The optical lens assembly of claim 1, wherein the augmentation mechanism comprises a rigid lens-coupling shuttle and a spring element.

12. The optical lens assembly of claim 1, wherein the augmentation mechanism comprises at least one of a metallic spring, an elastomeric spring, a composite material spring, a permanent magnet, a flexure element, a lever, or an electromagnetic element.

13. The optical lens assembly of claim 1, wherein the augmentation mechanism comprises a spring that is configured to act in compression, flexure, buckling, tension, torsion, or direct shear.

14. The optical lens assembly of claim 1, wherein the augmentation mechanism comprises a non-linear spring or flexure element positioned to apply a force to the deformable optical element in series or in parallel with the primary actuator.

15. The optical lens assembly of claim 1, wherein the augmentation mechanism is configured to apply a secondary force to the deformable optical element during only a portion of an actuation stroke of the primary actuator.

16. The optical lens assembly of claim 1, wherein the primary actuator comprises at least one of a perimeter-mounted piezoelectric actuator, a voice coil actuator, an electromagnetic motor actuator, a shape memory alloy actuator, or an electroactive polymer actuator.

17. The optical lens assembly of claim 1, further comprising a force distributor ring positioned adjacent to the deformable optical element, wherein the primary actuator is configured to apply a primary force to the deformable optical element through the force distributor ring.

18. A head-mounted display, comprising:
   a support frame;
   an optical lens assembly coupled to the support frame, the optical lens assembly comprising a deformable optical element;
   a primary actuator coupled to the support frame, the primary actuator configured to deform, and thus change at least one optical property of, the deformable optical element;
   an augmentation mechanism configured to augment the deformation of the deformable optical element, wherein actuation of the augmentation mechanism is at least partially dependent on actuation of the primary actuator; and
   a display element coupled to the support frame.

19. The head-mounted display of claim 18, wherein the augmentation mechanism comprises at least one of a cam, a coil spring, a disk spring, a shuttle, or a magnetic element.

20. The head-mounted display of claim 18, further comprising another optical lens assembly coupled to the support frame, the other optical lens assembly comprising another deformable optical element, wherein:
   the display element is positioned between the optical lens assembly and the other optical lens assembly; and
   the primary actuator and the augmentation mechanism are configured to simultaneously deform both the deformable optical element and the other deformable optical element.

21. The head-mounted display of claim 18, wherein the augmentation mechanism is configured to apply a reduced force to the deformable optical element in a first position between second positions in which the augmentation mechanism applies an increased force to the deformable optical element.

22. A method of altering optical properties of an optical lens assembly, comprising:
   deforming, with a primary actuator, a deformable optical element to alter an optical property of the deformable optical element; and
   augmenting, with an augmentation mechanism, the deformation of the deformable optical element by the primary actuator, wherein the augmentation mechanism comprises at least one of: a cam; a spring; a rigid lens-coupling shuttle and a spring element; or a permanent magnet.

23. The method of claim 22, wherein augmenting, with the augmentation mechanism, the deformation of the deformable optical element comprises changing the augmentation mechanism from a higher potential energy state to a lower potential energy state.

24. The method of claim 22, wherein augmenting, with the augmentation mechanism, the deformation of the deformable optical element comprises applying a force to the deformable optical element with the augmentation mechanism through a force distributor ring.

* * * * *